US005932391A

United States Patent [19]

Ushirogouchi et al.

[11] Patent Number: 5,932,391

[45] Date of Patent: Aug. 3, 1999

[54] RESIST FOR ALKALI DEVELOPMENT

[75] Inventors: Toru Ushirogouchi, Yokohama; Koji Asakawa, Kawasaki; Naoko Kihara, Matsudo; Makoto Nakase, Tokyo; Naomi Shida, Kawasaki; Takeshi Okino, Yokohama, all of Japan

[73] Assignee: Kabushiki Kaisha Toshiba, Kawasaki, Japan

[21] Appl. No.: 08/697,009

[22] Filed: Aug. 16, 1996

[30] Foreign Application Priority Data

Aug. 18, 1995 [JP] Japan .................................... 7-210312

[51] Int. Cl.[6] ............................. G03F 7/004; G03F 7/021

[52] U.S. Cl. ....................... 430/270.1; 430/170; 430/176; 430/905; 430/910

[58] Field of Search ................................ 430/270.1, 170, 430/905, 910, 176, 920

[56] References Cited

U.S. PATENT DOCUMENTS

| | | | |
|---|---|---|---|
| 4,035,979 | 7/1991 | Nguyen-Kim et al. | 430/270.1 |
| 4,912,018 | 3/1990 | Osuch et al. . | |
| 4,962,171 | 10/1990 | Osuch et al. | 430/270.1 |
| 5,034,305 | 7/1991 | Nguyen et al. | 430/270.1 |
| 5,399,647 | 3/1995 | Nozaki et al. | 430/270.1 |
| 5,443,690 | 8/1995 | Takechi et al. | 430/286 |
| 5,532,106 | 7/1996 | Frechet et al. | 430/270.1 |
| 5,580,694 | 12/1996 | Allen et al. | 430/270.1 |
| 5,585,218 | 12/1996 | Nakano et al. | 430/270.1 |
| 5,635,332 | 6/1997 | Nakano et al. | 430/270.1 |
| 5,660,969 | 8/1997 | Kaimoto | 430/270.1 |

FOREIGN PATENT DOCUMENTS

| | | |
|---|---|---|
| 2-146045 | 6/1990 | Japan . |
| 4-39665 | 2/1992 | Japan . |
| 4-215660 | 8/1992 | Japan . |
| 5-107762 | 4/1993 | Japan . |

*Primary Examiner*—John S. Chu
*Attorney, Agent, or Firm*—Oblon, Spivak, McClelland, Maier & Neustadt, P.C.

[57] ABSTRACT

A resist for alkali development, which comprises an alicyclic compound attached with an acidic substituent group exhibiting pKa of 7 to 11 in an aqueous solution of 25° C. This alicyclic compound is preferably a copolymer comprising as a comonomer component a vinyl compound and exhibiting a light absorbency of 3 or less per 1 μm to the light of 193 nm in wavelength.

30 Claims, No Drawings

RESIST FOR ALKALI DEVELOPMENT

BACKGROUND OF THE INVENTION

1. Field of the Invention

This invention relates to a resist for alkali development which is useful for a fine working technique in the manufacture for example of a semiconductor element and the like.

2. Description of the Related Art

In the manufacture of electronic parts such as an LSI, a fine working technique utilizing a photolithography has been employed. In this fine working technique, a resist film is first formed by coating a resist solution onto a semiconductor substrate. The resist film thus formed is then exposed to light through a prescribed mask pattern, and subsequently subjected to various treatments including an alkali development, thereby forming a resist pattern. This resist pattern is then utilized as an etching resistant mask in a dry etching process, and the exposed surface portions of the substrate are etched away to form a pattern of fine lines or openings. Finally, the resist pattern remaining on the substrate is removed through ashing.

Therefore, the resist to be employed in this process is generally required to have a high dry-etching resistance. In view of this requirement, a resist comprising an aromatic compound has been extensively employed. For example, many kinds of resists comprising an alkali-soluble novolak resin as a base resin have been developed up to date.

In view of a trend in recent years to further increase the integration of semiconductor elements such as seen in an LSI, the aforementioned fine working technique in recent years has made it possible to realize a fine pattern of the order of sub-half micron. It is expected that this trend to further increase the fineness of pattern will be further promoted in future. In order to meet such a trend, the use of light source of shorter wavelength in photolithography is now being studied. For example, a method for forming a finer resist pattern through the use of ArF excimer laser (193 nm in wavelength) or the quintuple harmonic of YAG laser (218 nm in wavelength) has been tried at present.

However, the aforementioned conventional resist comprising a novolak resin as a base resin generally exhibits a tendency to absorb the aforementioned light of short wavelength to a large extent at the benzene nucleus of the novolak resin. Therefore, it is impossible, because of this large light absorption ratio, to allow the exposure light to reach deep enough to an interface between the resist film and the substrate, thus making it very difficult to form in high sensitivity a fine pattern which is excellent in shape and in precision.

Since the resist comprising a novolak resin as a base resin is insufficient in transparency to the light of short wavelength as mentioned above in spite of its excellent dry-etching resistance and its alkali-developing properties, there has been a strong demand for the development of a new resist which is suited for use in a photolithography where the ArF excimer laser or the quintuple harmonic of YAG laser is employed.

In view of this, a resist where an alicyclic compound is employed in place of an aromatic compound is recently attracting attention. For example, a resist comprising a polymer having an adamantane side chain as a base resin is proposed in Japanese Patent Unexamined Publication Hei/4-39665, the resin being excellent in dry etching resistance and in transparency to a light of short wavelength. There is also disclosed in this prior art an example where a compound having an adamantane side chain is copolymerized with an acrylic compound having a carboxylic group to provide a copolymer having an alkali-solubility so as to form a resist pattern by way of an alkali development.

However, there are various problems in an alkali development of a resist pattern by the use of resist comprising an alicyclic compound, because the alkali-solubility of an alicyclic structure such as the adamantane differs greatly from that of carboxylic group. For example, the solubility and elimination of a predetermined region of a resist film becomes non-uniform at the occasion of development, thereby inviting not only the deterioration of resolution, but also the generation of cracks or surface roughening due to partial dissolution of a resist film portion which should have been kept unremoved. Moreover, an alkali solution may penetrate into an interface between the resist film and the substrate, thereby causing a peeling of the resist pattern. Additionally, a phase separation between the alicyclic structure portion and the carboxylic group portion may be readily proceeded, thus making it difficult to prepare a homogeneous resist solution and deteriorating the coating properties of the resist solution.

SUMMARY OF THE INVENTION

The present invention has been accomplished in view of overcoming the aforementioned problems, and therefore the object of the present invention is to provide a resist for alkali development, which is excellent in transparency to the light of short wavelength as well as in dry etching resistance, and capable of forming a resist pattern of high resolution by way of alkali development.

According to this invention, there is provided a resist for alkali development, which comprises an alicyclic compound attached with an acidic substituent group exhibiting pKa of 7 to 11 in an aqueous solution of 25° C.

According to this invention, there is further provided a resist for alkali development, which contains a polymer comprising an alicyclic monomer attached with an acidic substituent group exhibiting pKa of 7 to 11 in an aqueous solution of 25° C.

According to this invention, there is further provided a resist for alkali development, which comprises a compound comprising at least one kind of structural units represented by the following general formulas (1) to (3):

(1)

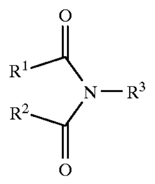

wherein at least one of $R^1$, $R^2$ and $R^3$ is a monovalent organic group including an alicyclic group, the other being alkyl group; $R^1$ and $R^2$ may be partially connected together to form a cyclic compound; and $R^3$ may be hydroxyl group.

(2)

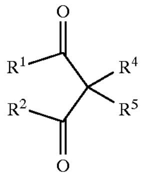

wherein at least one of $R^1$, $R^2$, $R^4$ and $R^5$ is a monovalent organic group including an alicyclic group, the remainder being hydrogen atom or alkyl group; $R^1$ and $R^2$ may be partially connected together to form a cyclic compound; and $R^4$ and $R^5$ may also be partially connected together to form a cyclic compound.

(3)

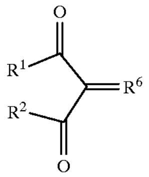

wherein at least one of $R^1$, $R^2$ and $R^6$ is a monovalent organic group including an alicyclic group, the remainder being hydrogen atom or alkyl group; and $R^1$ and $R^2$ may be partially connected together to form a cyclic compound.

According to this invention, there is further provided a resist for alkali development, which contains a polymer comprising an alicyclic monomer compound attached with an acidic substituent group exhibiting pKa of 7 to 11 in an aqueous solution of 25° C., the alicyclic monomer compound being a compound comprising at least one kind of structural units represented by the following general formulas (1) to (3):

(1)

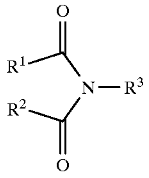

wherein at least one of $R^1$, $R^2$ and $R^3$ is a monovalent organic group including an alicyclic group, the other being alkyl group; $R^1$ and $R^2$ may be partially connected together to form a cyclic compound; and $R^3$ may be hydroxyl group.

(2)

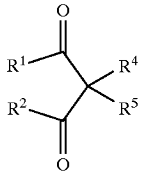

wherein at least one of $R^1$, $R^2$, $R^4$ and $R^5$ is a monovalent organic group including an alicyclic group, the remainder being hydrogen atom or alkyl group; $R^1$ and $R^2$ may be partially connected together to form a cyclic compound; and $R^4$ and $R^5$ may also be partially connected together to form a cyclic compound.

(3)

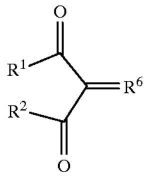

wherein at least one of $R^1$, $R^2$ and $R^6$ is a monovalent organic group including an alicyclic group, the remainder being hydrogen atom or alkyl group; and $R^1$ and $R^2$ may be partially connected together to form a cyclic compound.

DETAILED DESCRIPTION OF THE PREFERRED EMBODIMENTS

This invention will be further explained as follows.

As for the alicyclic compound to be employed in the resist for alkali development of this invention, monocyclic compounds represented by the general formula $C_nH_{2n}$ (n is an integer of 3 or more), bicyclic compounds or condensed rings of these cyclic compounds may be employed. Specific examples thereof include cyclobutane; cyclopentane; cyclohexane; cycloheptane; any of above-mentioned monocyclic compounds attached with a bridging hydrocarbon; a spiro ring such as spiroheptane or spirooctane; a terpene ring such as norbornyl, adamanthyl, bornene, menthyl or menthane; a steroid skeleton such as thujane, sabinene, thujone, carane, carene, pinane, norpinane, bornane, fenchane, tricyllene or cholesteric ring; bile acid; digitaloid; camphoric ring; isocamphoric ring; sesquiterpene; santonic ring; diterpene; triterpene; and steroidsaponin.

As for the acidic substituent group to be introduced into the alicyclic structure, an organic group having a keto-oxime structure such as propanone oxime, propanal oxime, hydroxyiminopentanone and dimethylglyoxime; an organic group having a N-hydroxysuccinic imide structure; an organic group having a dicarbonyl methylene structure such as cyclopentene 1,3-dione, acetylacetone and 3-methyl-2,4-pentadione; an organic group having a sulfamyl structure; an organic group having a polysubstituted thiol such as hexane thiol; an organic group having a tautomeric alcohol or carbamate; an organic group having furfuryl alcohol; an organic group having an amic acid structure; an organic group having a phenolic hydroxyl group such as phenol, cresol and salicylaldehyde; and an organic group having a triazine skeleton may be used. However, since the organic group having phenolic hydroxyl group and the organic group having a triazine skeleton are highly absorptive to the light of short wavelength, other kinds of acidic substituent group excluding these organic groups should preferably be incorporated into the alicyclic structure in this invention. Examples of preferable acidic substituent group are as follows.

(1)

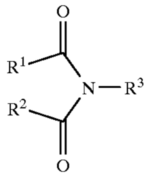

wherein at least one of $R^1$, $R^2$ and $R^3$ is a monovalent organic group including an alicyclic group, the other being alkyl group; $R^1$ and $R^2$ may be partially connected together to form a cyclic compound; and $R^3$ may be hydroxyl group.

(2)

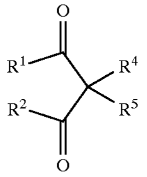

wherein at least one of $R^1$, $R^2$, $R^4$ and $R^5$ is a monovalent organic group including an alicyclic group, the remainder being hydrogen atom or alkyl group; $R^1$ and $R^2$ may be partially connected together to form a cyclic compound; and $R^4$ and $R^5$ may also be partially connected together to form a cyclic compound.

(3)

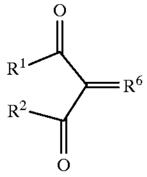

wherein at least one of $R^1$, $R^2$ and $R^6$ is a monovalent organic group including an alicyclic group, the remainder being hydrogen atom or alkyl group; and $R^1$ and $R^2$ may be partially connected together to form a cyclic compound.

The reason for limiting the range of pKa of the acidic substituent group to 7 to 11 is as follows. Namely, if the value of pKa of the acidic substituent group is less than 7, a difference in alkali-solubility between the alicyclic structure and the acidic substituent group becomes too large to form a resist pattern excellent in resolution by means of an alkali development. On the other hand, if the value of pKa exceeds over 11, almost no improvement in alkali-developing properties can be expected. Preferable range of pKa value is from 9 to 10. Since the acidic substituent group represented by the general formula (3) includes double bonds, it has a few photo-reactivity such that the double bond cleavage is occur when irradiated with light. In this case, photo-product of the compounds have similar acidity of the compound represented by the general formula (2), but the value of pKa of the original compounds may more than 11.

In the compounds having formula (1), significant amount of acid species are trapped by the nitrogen atom when the structure is $R^3$=H. This usually reveal low sensitivity of chemically amplified resist system. From this reason, it is imperative that $R^3$=OH or alkyl group in the chemically amplification system.

As explained above, the alicyclic compound having the aforementioned acidic substituent group incorporated therein may be contained in a polymer. In this case, the employment of a copolymer that can be obtained by a copolymerization of an alicyclic compound monomer mentioned above and a vinyl compound is preferable in particular. Such a copolymer can be easily obtained by allowing an alicyclic compound having an acidic substituent group and a polymerizable double bond in its molecule by means of radical polymerization, cationic polymerization or anionic polymerization. compound in the presence of a Ziegler-Natta catalyst. Generally, a polymerizable compound having an alicyclic compound and a polymerizable double bond can be polymerized by making use of a Ziegler-Natta catalyst, thereby forming a polymer of high molecular weight. However, since a polymer of low molecular weight can be also useful in this invention as long as it can be formed into a film, any convenient polymerization method such as radical polymerization may be adopted, thus preparing a mixture of a low molecular weight compound and a high molecular weight compound. When the low molecular weight compound is contained in the polymer compound, the alkali-solubility of the resist is improved. However, a content of the low molecular weight compound in the polymer is 50% or higher, it would be difficult to form a film. Therefore, the content of the low molecular weight compound should preferably be less than 50%. In this case, it may be preferable, in view of adjusting the alkali-solubility of a high molecular weight compound or improving adhesivity between the resist and the substrate, to further copolymerize the alicyclic compound with any of acrylic acid, maleic anhydride, an ester substituent of these acids, vinylphenol, vinylnaphthol, naphthol oxymethacrylate, hydroxymethylacrylate and $SO_2$. It is also possible to further copolymerize the alicyclic compound with an alkali-soluble compound having an alkali-soluble group protected with an acid-decomposable group having solubility-inhibiting properties to alkaline solution. However, in view of ensuring the transparency of the resist to light of short wavelength, it is preferable to copolymerize the alicyclic compound with a compound excluding those having a molecular skeleton which is high in light absorption at a short wavelength zone, such as benzene nucleus. Specifically, the light absorbency of the polymer compound to a wavelength of 193 nm should preferably be 3 or less per 1 $\mu$m. A resist comprising the polymer compound having the light absorbency above mentioned is effectively use to an exposure using ArF excimer laser especially.

In this case, the copolymerization ratio of alkali-soluble compound such as acrylic acid in a copolymer should preferably be 1 to 50%, more preferably be 10 to 50%. If the copolymerization ratio of alkali-soluble compound is less than 1%, the alkali-solubility of the polymer compound may become insufficient. On the other hand, if the copolymerization ratio of alkali-soluble compound exceeds over 50%, it may give rise to a non-uniform dissolution of the polymer compound, so that the formation of a resist pattern may become difficult.

The average molecular weight of aforementioned polymer compound according to this invention should preferably be 500 to 500,000. If the average molecular weight of the polymer compound is less than 500, it may be difficult to form a resist film having a sufficient mechanical strength. On the other hand, if the average molecular weight of the polymer compound exceeds over 500,000, it may be difficult to form a resist film having an excellent resolution. Even though the polymer compounds mentioned above are generally formed of a mixture of compounds of various molecular weights, the effect of this invention can be obtained even if the polymer compound is formed of compounds of relatively low molecular weight. For example, even if most of the polymers are of low average molecular weight ranging from 500 to 1,000, it is possible to inhibit a non-uniform dissolution. Furthermore, even if a large amount of monomer is remained in a resin in this case, the dissolution properties and dry etching resistance of the polymer compound would hardly be deteriorated.

The polymer compound constituting a base resin in the resist for alkali development of this invention should preferably be free from hetero atoms other than oxygen atom and nitrogen atom. In other words, the polymer compound should preferably be constituted, in addition to carbon atom and hydrogen atom, by only at least one kind of atom selected from oxygen atom and nitrogen atom. This is because the employment of a polymer compound containing a hetero atom other than oxygen atom and nitrogen atom, such as sulfur atom may invite a cause of environmental problem, and at the same time when a resist for alkali development containing such a polymer compound as base resin is employed for forming a resist pattern, the ashing after the employment of the resist as an etching mask may become very complicated.

In the case of a positive type resist, the examples of the resist for alkali development include a resin composition comprising an alkali-soluble resin whose backbone chain can be cut off by an irradiation of radiant ray or a resin composition comprising a compound whose solubility to an alkaline solution can be enhanced by an irradiation of radiant ray. On the other hand, in the case of negative type resist, the examples of the resist for alkali development include a resin composition comprising an alkali-soluble resin which can be cross-linked by an irradiation of radiant ray or a resin composition comprising a compound whose solubility to an alkaline solution can be lowered by an irradiation of radiant ray.

The employment of a chemically amplified resist whose photochemical reaction after light exposure can be enhanced by a thermal reaction is advantageous in forming a resist pattern in high sensitivity.

For example, a photo-sensitive composition comprising an alkali-soluble resin, a solubility-inhibiting agent such as an acid decomposable compound which is resistive in solubility to an alkaline solution, and a so-called photo-acid-generating agent which is capable of generating acid upon being irradiated by light may be employed as a positive type chemically amplified resist. More specifically, such a photo-sensitive composition can be prepared by selecting an acid decomposable compound as an alicyclic compound having an acidic substituent group, and mixing the acid decomposable compound with an alkali-soluble resin and a photo-acid-generating agent. In the case where the alicyclic compound having an acidic substituent group is included in a polymer, an alicyclic compound of acid decomposable type or a copolymer component of acid decomposable type may be selected, and the resultant polymer is mixed with a photo-acid-generating agent, thereby preparing a chemically amplified resist. The compounds described hereinabove may also be incorporated concurrently in the chemically amplified resist.

As for a negative type chemically amplified resist, a photo-sensitive composition comprising an alkali-soluble resin, a compound which is capable of cross-linking the alkali-soluble resin in the presence of acid or capable of lowering the solubility of the alkali-soluble resin to an alkaline solution, and a photo-acid-generating agent may be employed. More specifically, such a photo-sensitive composition can be prepared by selecting an acid cross-linkable compound as an alicyclic compound having an acidic substituent group, and mixing the acid cross-linkable compound with an alkali-soluble resin and a photo-acid-generating agent. In the case where the alicyclic compound having an acidic substituent group is included in a polymer, the acid cross-linkable compound and the photo-acid-generating agent may be mixed in this polymer, thereby preparing a chemically amplified resist. The compounds described hereinabove may also be incorporated concurrently in the chemically amplified resist.

In any of the chemically amplified resists, a polymer compound having an alicyclic structure attached with an acidic substituent group exhibiting pKa of 7 to 11 may be employed. Therefore, depending on the combination of this polymer compound with the aforementioned solubility-inhibiting agent or photo-acid-generating agent, either a positive resist which is insoluble to an alkaline solution before light exposure and becomes soluble to an alkaline solution after light exposure, or a negative resist which is soluble to an alkaline solution before light exposure and becomes insoluble to an alkaline solution after light exposure can be obtained.

The mixing ratios of components should preferably be adjusted such that the amount of the alicyclic compound having an acidic substituent group becomes 30% by weight or more based on the solid matters in the resist. If the amount of the alicyclic compound is less than 30% by weight, the formation of a resist pattern exhibiting an excellent resolution by means of alkali development would become difficult, and at the same time the dry etching resistance of the resultant resist pattern would be deteriorated.

It is possible, in the case of the chemically amplified resist of positive type, to protect the alkali-soluble group in the resin with an acid decomposable group having solubility-inhibiting properties in stead of incorporating a solubility-inhibiting agent, thereby forming a photo-sensitive composition containing such a resin and a photo-acid-generating agent. Likewise, in the case of the chemically amplified resist of negative type, it may be a photo-sensitive composition comprising an alkali-soluble resin having an acid cross-linking group incorporated therein and a photo-acid-generating agent.

Specifically, a polymerizable compound having an alicyclic structure accompanying an acidic substituent group having pKa of 7 to 11 and containing a polymerizable double bond in its molecule is copolymerized with a vinyl compound having an acid decomposable group or an acid-crosslinking group, thus obtaining a polymer compound to be used as a base resin. It is possible in this case to copolymerize the polymerizable compound with a compound having an alkali-soluble group.

Vinyl compounds useful in this case are methyl acrylate, methyl methacrylate, α-chloroacrylate, cyanoacrylate, trifluoromethyl acrylate, α-methyl styrene, trimethylsilyl methacrylate, trimethylsilyl α-chloroacrylate, trimethylsilylmethyl α-chloroacrylate, maleic anhydride, tetrahydropyranyl methacrylate, tetrahydropyranyl α-chloroacrylate, t-butyl methacrylate, t-butyl α-chloroacrylate, butadiene, glycidyl methacrylate, isobornyl methacrylate, menthyl methacrylate, norbornyl methacrylate, adamantyl methacrylate and allyl methacrylate.

Among these vinyl compounds, acrylic acid derivatives represented by the following general formula is most preferable.

(4)

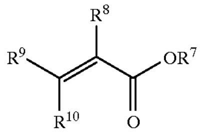

wherein $R^7$ is hydrogen atom or a monovalent organic group; $R^8$, $R^9$ and $R^{10}$ may be the same or different and are individually hydrogen atom, a halogen atom or an alkyl group.

As for the acid-decomposable group for protecting an alkali-soluble group in the resin in the positive type chemically amplified resist, it is possible to employ esters such as isopropyl ester, tetrahydropyranyl ester, tetrahydrofuranyl ester, methoxyethoxymethyl ester, 2-trimethylsilylethoxymethyl ester, 3-oxocyclohexyl ester, isobornyl ester, trimethylsilyl ester, triethylsilyl ester, isopropyldimethylsilyl ester, di-t-butylmethylsilyl ester, oxazole, 2-alkyl-1,3-oxazoline, 4-alkyl-5-oxo-1,3-oxazoline, 5-alkyl-4-oxo-1,3-dioxsolane; ethers such as t-butoxycarbonyl ether, t-butoxymethyl ether, 4-pentenyloxymethyl ether, tetrahydropyranyl ether, 3-bromotetrahydropyranyl ether, 1-methoxycyclohexyl ether, 4-methoxytetrahydropyranyl ether, 4-methoxytetrahydrothiopyranyl ether, 1,4-dioxan-2-yl ether, tetrahydrofuranyl ether, 2,3,3a,4,5,6,7,7a-octahydro-7,8,8-trimethyl-4,7-methanobenzofuran-2-yl ether, t-butyl ether, trimethylsilyl ether, triethylsilyl ether, triisopropylsilyl ether, dimethylisopropylsilyl ether, diethylisopropylsilyl ether, dimethylcexylsilyl ether and t-butyldimethylsilyl ether; acetals such as methylene acetal, ethylidene acetal, 2,2,2-trichloroethylidene acetal, 2,2,2-tribromoethylidene acetal and 2,2,2-triiodoethylidene acetal; ketals such as 1-t-butylethylidene ketal, isopropylidene ketal (acetonide), cyclopentylidene ketal, cyclohexylidene ketal and cycloheptylidene ketal; cyclic ortho-esters such as methoxymethylene acetal, ethoxymethylene acetal, dimethoxymethylene ortho-ester, 1-methoxyethylidene ortho-ester, 1-ethoxyethylidene ortho-ester, 1,2-dimethoxyethylidene ortho-ester, 1-N,N-dimethylaminoethylidene ortho-ester and 2-oxacyclopentylidene ortho-ester; silylketene acetals such as trimethylsilylketene acetal, triethylsilylketene acetal, triisopropylsilylketene acetal and t-butyldimethylsilylketene acetal; silyl ethers such as di-t-butylsilyl ether, 1,3-1',1',3',3'-tetraisopropyldisiloxanylidene ether and tetra-t-buthoxydisiloxane-1, 3-diylidene ether; acyclic acetals or ketals such as dimethyl acetal, dimethyl ketal, bis-2,2,2-trichloroethyl acetal, bis-2,2,2-tribromoethyl acetal, bis-2,2,2-triiodoethyl acetal, bis-2,2,2-trichloroethyl ketal, bis-2,2,2-tribromoethyl ketal, bis-2,2,2-triiodoethyl ketal, diacetyl acetal and diacetyl ketal; cyclic acetals or cyclic ketals such as 1,3-dioxane, 5-methylene-1,3-dioxane, 5,5-dibromo-1,3-dioxane, 1, 3-dioxolane, 4-bromomethyl-1,3-dioxorane, 4-3'-butenyl-1,3-dioxorane and 4,5-dimethoxymethyl-1,3-dioxoran; cyanohydrines such as o-trimethylsilyl cyanohydrine, o-1-ethoxyethyl cyanohydrine and o-tetrahydropyranyl cyanohydrine.

Among them, those more preferable in view of their excellent acid-decomposability are t-butyl esters such as t-butyl methacrylate, ethoxyethyl methacrylate, 3-oxocyclohexyl methacrylate, t-butyl-3-naphthyl-2-propenoate, isobornyl methacrylate, trimethylsilyl methacrylate and tetrahydropyranyl methacrylate; trimethylsilyl ester; and tetrahydropyranyl ester. In this case, it is also possible to employ acrylates in place of above exemplified methacrylates.

The employment of an acid decomposable compound containing a structural unit represented by the following general formula (5) is preferable because it falls under the structure of this invention as well as in view of its suitable degree of hydrolyzing properties and its effect of promoting the solubility of an light-exposed portion.

(5)

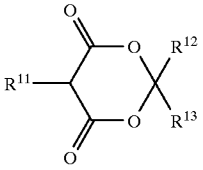

wherein $R_{11}$, $R^{12}$ and $R^{13}$ represent an alkyl group; at least one of $R^{11}$, $R^{12}$ and $R^{13}$ is an alicyclic group; $R^{12}$ and $R^{13}$ may be partially connected together to form a cyclic compound; and the linkage to $R^{11}$ may be a double bond, since this double bond may be ultimately converted to a single bond when it is exposed to ultraviolet ray of short wavelength.

When the aforementioned compounds are to be employed as a mixture with an alkali-solubility-promoting agent, the content of the alkali-solubility-promoting agent should preferably be restricted to 5 to 60%, more preferably 10 to 40% based on the weight of the polymer. Because, if the content of the alkali-solubility-promoting agent is less than 5%, a sufficient solubility-promoting effect can not be expected, whereas if the content of the alkali-solubility-promoting agent exceeds over 40%, it may become difficult to form a resist pattern excellent in resolution and at the same time the coating properties thereof will be deteriorated.

When the aforementioned copolymers are to be employed as a base resin, the copolymerization ratio by a component such as vinyl compound having an acid decomposable group should preferably be confined to a range of 10 to 80%, more preferably 15 to 70%. Because, if the copolymerization ratio is less than 10%, a sufficient solubility-inhibiting effect can not be expected, whereas if the copolymerization ratio exceeds over 80%, it may become difficult to form a resist pattern excellent in resolution.

When a polymer comprising an alicyclic monomer attached with an acidic substituent group exhibiting pKa of 7 to 11 in an aqueous solution of 25° C. is to be employed as simply an alkali-soluble resin in this invention, such a polymerizable compound having an alicyclic structure containing such an acid substituent group and a polymerizable double bond in its molecule may be copolymerized with an acrylic acid represented by the general formula (4). It is also possible in this case to introduce any suitable organic group into $R^7$ of the general formula (4) representing acrylic acid so as to adjust the alkali-solubility of the polymer compound. However, the copolymerization ratio by such an acrylic derivative should preferably be confined to a range of 1 to 70%, more preferably 1 to 50% in view of obtaining a resist pattern which is excellent in resolution.

As for the aforementioned solubility-inhibiting agent to be employed in this invention, an acid-decomposable compound which exhibits a sufficient solubility-inhibiting property to an alkaline solution and is capable of generating radicals such as —(C═O)O—, —OS(═O)$_2$—, or —O— in an alkali solution upon being decomposed by an acid may be employed.

Examples of such an acid-decomposable compound are ones which can be derived by modifying phenolic compounds with t-butoxycarbonyl ether, tetrahydropyranyl ether, 3-bromotetrahydropyranyl ether, 1-methoxycyclohexyl ether, 4-methoxytetrahydropyranyl ether, 1,4-dioxan-2-yl ether, tetrahydrofuranyl ether, 2,3,3a,4,5,6,7,7a-octahydro-7,8,8-trimethyl-4,7-methanobenzofuran-2-yl ether, t-butyl ether, trimethylsilyl ether, triethylsilyl ether, triisopropylsilyl ether, dimethylisopropylsilyl ether, diethylisopropylsilyl ether, dimethylcexylsilyl ether and t-butyldimethylsilyl ether. It is also possible to employ as a solubility-inhibiting agent Meldrum's acid derivatives. Among these compounds, preferable examples are those which can be derived by protecting the hydroxyl group of a phenolic compound with t-butoxycarbonyl group, t-butoxycarbonylmethyl group, trimethylsilyl group, t-butyldimethylsilyl group or tetrahydropyranyl group; a compound which can be obtained by attaching Meldrum's acid to naphthaldehyde; and a compound which can be obtained by attaching Meldrum's acid to carbonyl compound having an alicyclic structure.

The solubility-inhibiting agent according to this invention may be esters of polycarboxylic acid, such as isopropyl ester, tetrahydropyranyl ester, tetrahydrofuranyl ester, methoxyethoxymethyl ester, 2-trimethylsilylethoxymethyl ester, t-butyl ester, trimethylsilyl ester, triethylsilyl ester, t-butyldimethylsilyl ester, isopropyldimethylsilyl ester, di-t-butyldimethylsilyl ester, oxazole, 2-alkyl-1,3-oxazoline, 4-alkyl-5-oxo-1,3-oxazoline and 5-alkyl-4-oxo-1,3-dioxsolane.

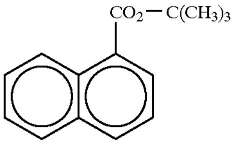

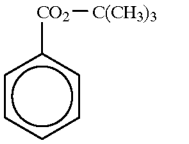

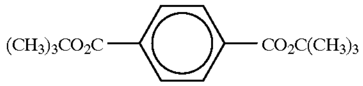

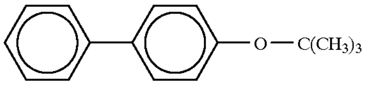

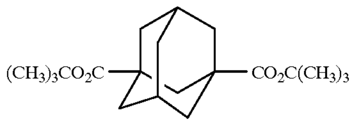

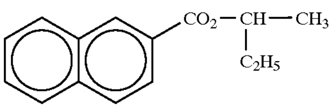

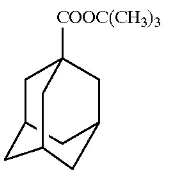

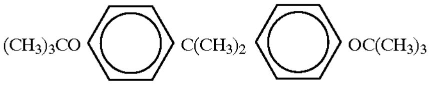

-continued

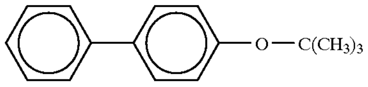

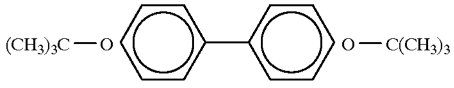

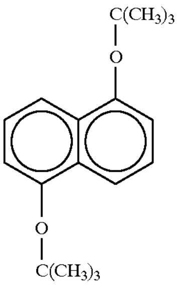

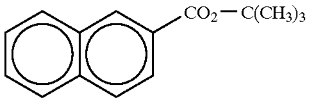

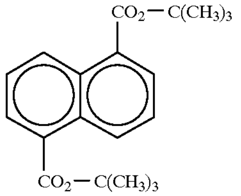

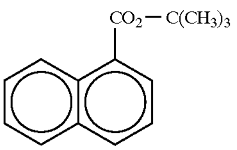

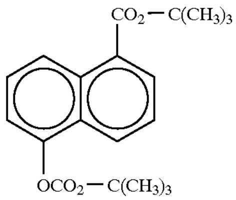

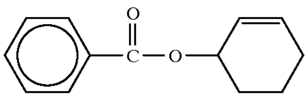

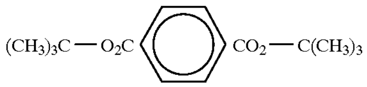

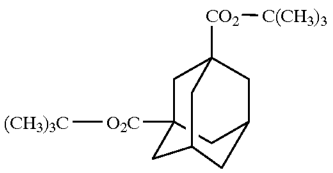

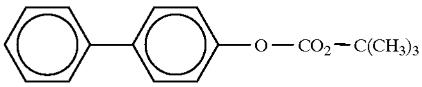

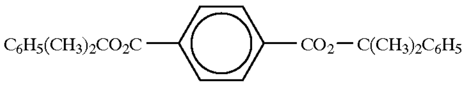

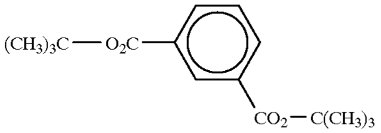

-continued
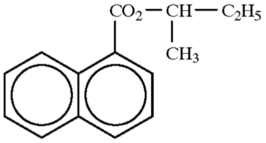
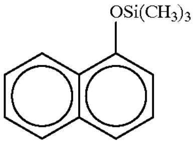
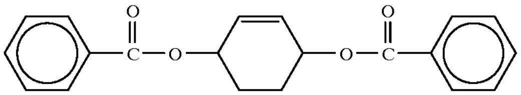
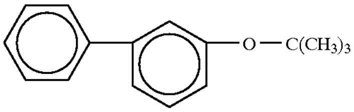
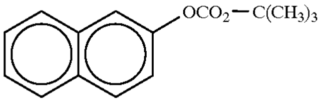
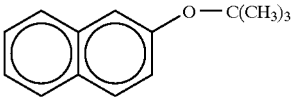
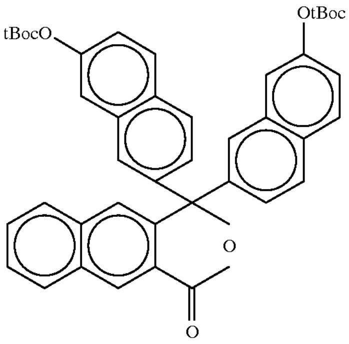
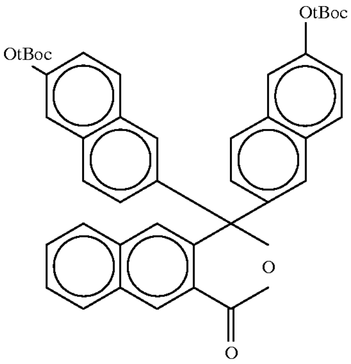
-continued
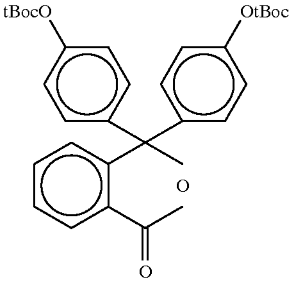
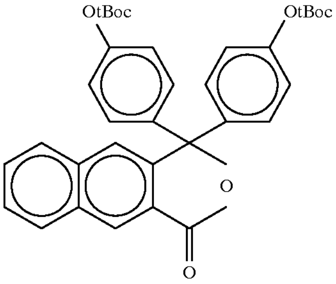
wherein tBoc represents $—(C{=}O)O—C(CH_3)_3$

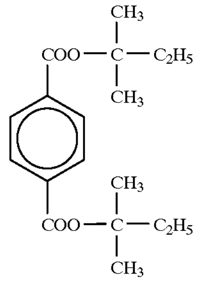
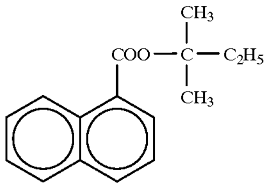
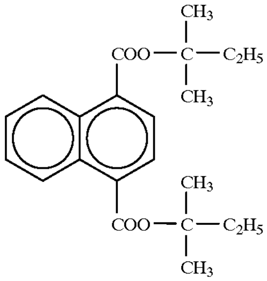
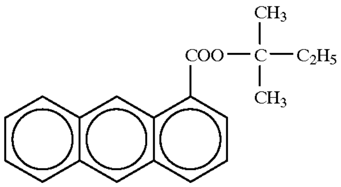
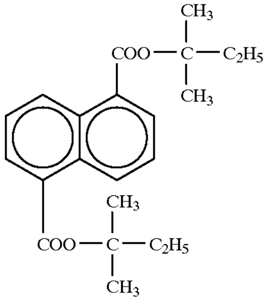
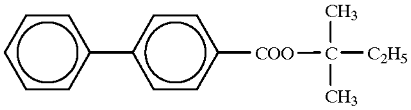
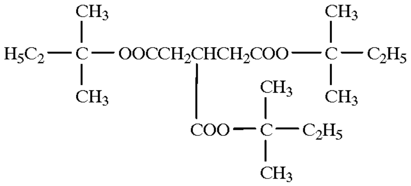
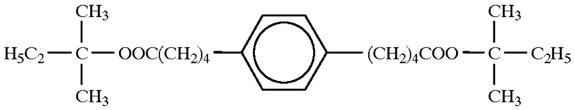
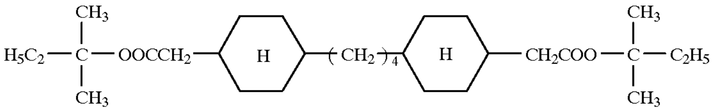
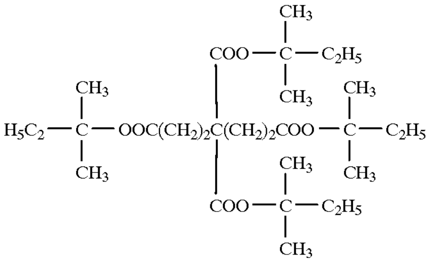

-continued

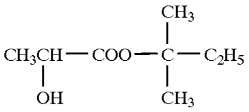

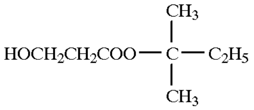

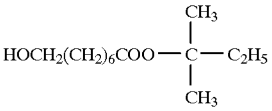

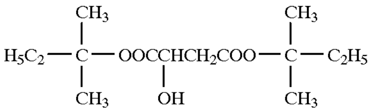

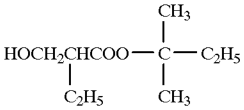

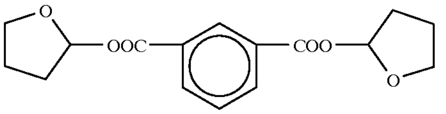

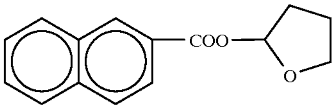

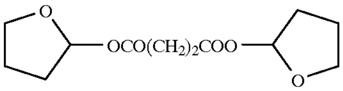

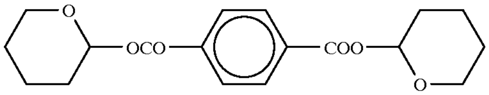

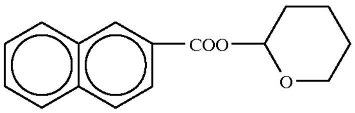

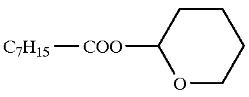

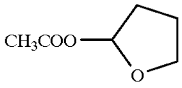

Out of these solubility-inhibiting agents, a conjugated polycyclic aromatic compound is more useful in this invention in view of its excellent transparency to the light of short wavelength. This conjugated polycyclic aromatic compound is formed of a skeleton wherein unsaturated bonds are arranged alternately, thus forming a non-condensed polycyclic or condensed polycyclic compound where a plurality of aromatic rings are flatly connected with each other. In the compound of this kind, the light absorption zone thereof is shifted to a lower wavelength region due to the conjugate stabilization of $\pi$ electron, so that, with the employment of this conjugated polycyclic aromatic compound as a solubility-inhibiting agent in this invention, it is possible to obtain a resist for alkali development which is excellent in heat resistance and in transparency to the light of short wavelength.

Specific examples of such a conjugated polycyclic aromatic compound are compounds having any of naphthalene ring, anthracene ring, phenanthrene ring, pyrene ring, naphthacene ring, chrysene ring, 3,4-benzophenanthrene ring, perylene ring, pentacene ring, picene ring, pyrrole ring, benzofuran ring, benzothiophene ring, indole ring, benzoxazole ring, benzothiazole ring, indazole ring, chromene ring, quinoline cinnoline ring, phthalazine ring, quinazoline ring, dibenzofuran ring, carbazole ring, acridine ring, phenanthridine ring, phenanthroline ring, phenazine ring, thianthrene ring, indolizine ring, naphthyridine ring, purine ring, pteridine ring and fluorene ring.

Among them, condensed polycyclic compounds having a naphthalene ring, an anthracene ring or a phenanthrene ring are more excellent in transparency to the light of 193 nm in wavelength. Therefore, a polyhydroxy compound having any of these condensed aromatic ring structure whose hydroxyl group is protected with t-butylcarbonate, t-butyl ester, tetrahydropyranyl ether, acetal or trimethylsilyl ether; or a condensed compound derived from a reaction between aldehyde compound and Meldrum's acid are preferable in particular as a solubility-inhibiting agent.

It may be also preferable in this invention to co-use a naphthol novolak compound having a molecular weight of 200 to 2,000 as a solubility-inhibiting agent in addition to the aforementioned acid decomposable compounds. This naphthol novolak compound may be employed solely as a solubility-inhibiting agent, if the alkali-soluble group in the base resin is protected with an acid decomposable group having a dissolution-inhibiting property to an alkaline solution. This naphthol novolak compound may be obtained by condensing naphthol or a derivative thereof with a carbonyl compound.

The mixing ratio of the dissolution-inhibiting agent in the resist for alkali development of this invention is preferably 3 to 50 mol %, more preferably 10 to 40 mol % based on the number of moles of monomer (or monomeric unit) in the base resin. If the mixing ratio of the dissolution-inhibiting agent is less than 3%, it would be difficult to obtain a resist pattern excellent in resolution. On the other hand, if the mixing ratio of the dissolution-inhibiting agent exceeds over 50%, the mechanical strength of the resultant resist film may be deteriorated and at the same time the dissolution rate at the occasion of removing the light-exposed portion of resist through the dissolution with an alkaline solution may be extremely lowered.

Examples of the photo-acid-generating agent to be incorporated into a resist for alkali development of this invention when the resist is of chemically amplified type include an arylonium salt, a naphthoquinone azide compound, a diazonium salt, a sulfonate compound, a sulfonium compound, a sulfamide compound, an iodonium compound and sulfonyl diazomethane.

Specific examples of these compounds are triphenylsufonium triflate, diphenyliodonium triflate, 2,3,4,4-tetrahydroxybenzophenone-4-naphthoquinonediazide sulfonate, 4-N-phenylamino-2-methoxyphenyldiazonium sulfate, 4-N-phenylamino-2-methoxyphenyldiazonium p-ethylphenyl sulfate, 4-N-phenylamino-2-methoxyphenyldiazonium 2-naphthyl sulfate, 4-N-phenylamino-2-methoxyphenyldiazonium phenyl sulfate, 2,5-diethoxy-4-N-4'-methoxyphenylcarbonylphenyl diazonium 3-carboxy-4-hydroxyphenyl sulfate, 2-methoxy-4-N-phenylphenyldiazonium 3-carboxy-4-hydroxyphenyl sulfate, diphenylsulfonylmethane, diphenylsulfonyldiazomethane, diphenyldisulfone, α-methylbenzoin tosylate, pyrogallol trimecylate, benzoin tosylate, MPI-103 (CAS.No.[87709-41-9], Midori Kagaku Co., Ltd.), BDS-105 (CAS.No.[145612-66-4], Midori Kagaku Co., Ltd.), NDS-103 (CAS.No.[110098-97-0], Midori Kagaku Co., Ltd.), MDS-203 (CAS.No.[127855-15-5], Midori Kagaku Co., Ltd.), Pyrogallol tritosylate (CAS.No.[20032-64-8], Midori Kagaku Co., Ltd.), DTS-102 (CAS.No.[75482-18-7], Midori Kagaku Co., Ltd.), DTS-103 (CAS.No.[71449-78-0], Midori Kagaku Co., Ltd.), MDS-103 (CAS.No.[127279-74-7], Midori Kagaku Co., Ltd.), MDS-105 (CAS.No.[116808-67-4], Midori Kagaku Co., Ltd.), MDS-205 (CAS.No.[81416-37-7], Midori Kagaku Co., Ltd.), BMS-105 (CAS.No.[149934-68-9), Midori Kagaku Co., Ltd.), TMS-105 (CAS.No.[127820-38-6], Midori Kagaku Co., Ltd.), NB-101 (CAS.No.[20444-09-1], Midori Kagaku Co., Ltd.), NB-201 (CAS.No.[4450-68-4], Midori Kagaku Co., Ltd.), DNB-101 (CAS.No.[114719-51-6], Midori Kagaku Co., Ltd.), DNB-102 (CAS.No.[131509-55-2], Midori Kagaku Co., Ltd.), DNB-103 (CAS.No.[132898-35-2], Midori Kagaku Co., Ltd.), DNB-104 (CAS.No.[132898-36-3], Midori Kagaku Co., Ltd.), DNB-105 (CAS.No.[132898-37-4], Midori Kagaku Co., Ltd.), DAM-101 (CAS.No.[1886-74-4], Midori Kagaku Co., Ltd.), DAM-102 (CAS.No.(28343-24-0], Midori Kagaku Co., Ltd.), DAM-103 (CAS.No.[14159-45-6], Midori Kagaku Co., Ltd.), DAM-104 (CAS.No.[130290-80-1], CAS.No.[130290-82-3], Midori Kagaku Co., Ltd.), DAM-201 (CAS.No.[28322-50-1], Midori Kagaku Co., Ltd.), CMS-105, DAM-301 (CAS.No.[138529-81-4], Midori Kagaku Co., Ltd.), SI-105 (CAS.No.[34694-40-7], Midori Kagaku Co., Ltd.), NDI-105 (CAS.No.[133710-62-0], Midori Kagaku Co., Ltd.), and EPI-105 (CAS.No.[135133-12-9], Midori Kagaku Co., Ltd.). It is also possible to employ the following compounds.

FDS-105

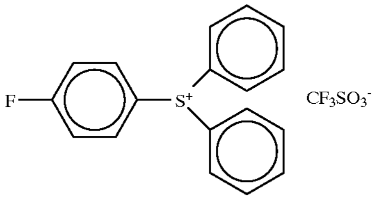

MDS-305

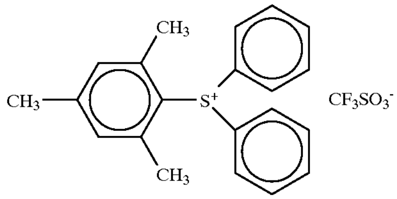

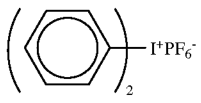

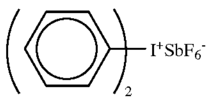

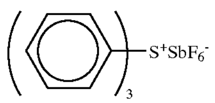

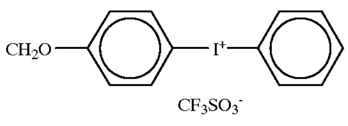

-continued
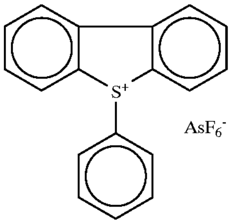
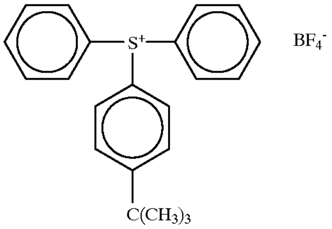
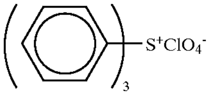
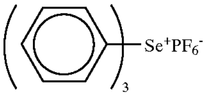
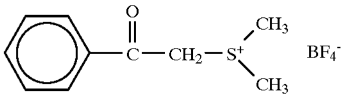
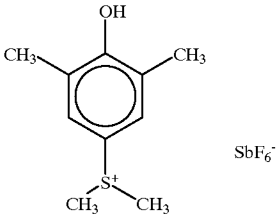
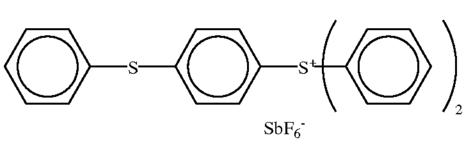
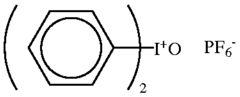
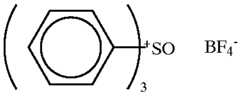
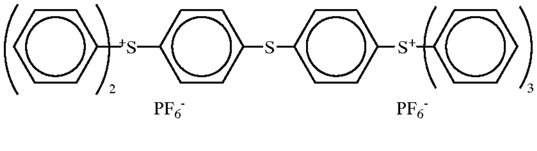
-continued
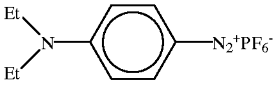
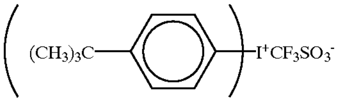
$[C_6H_5Fe^+C_6H_5]$ $PF_6^-$
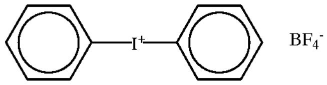
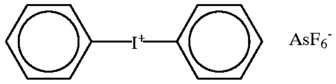
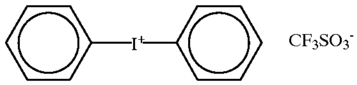
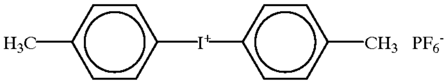
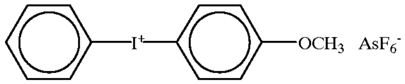
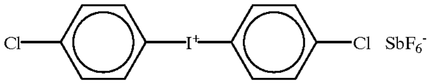
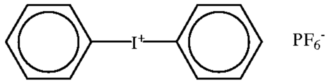
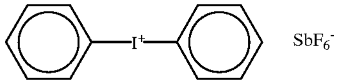
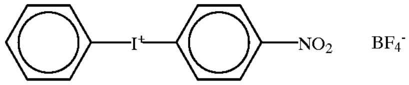
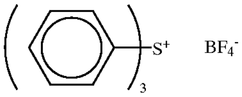
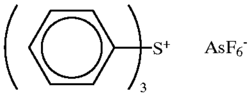
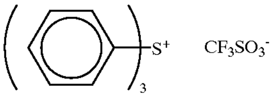

-continued
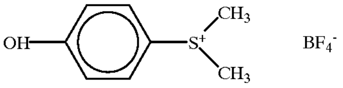
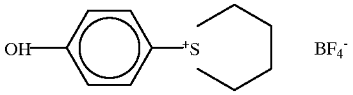
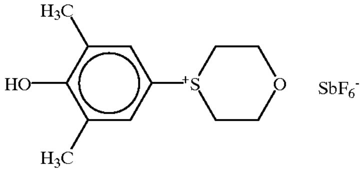
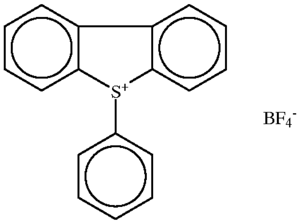
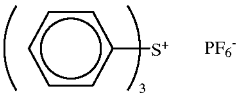
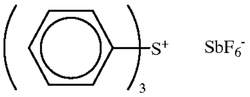
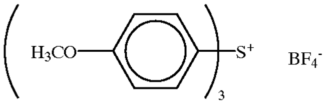
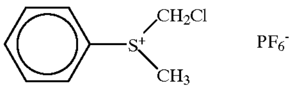
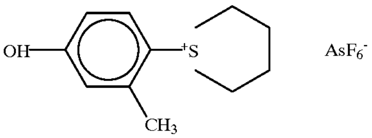
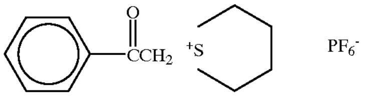
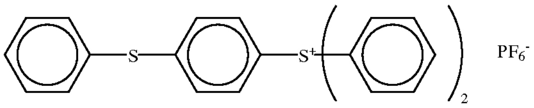
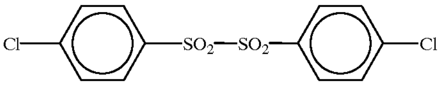
-continued
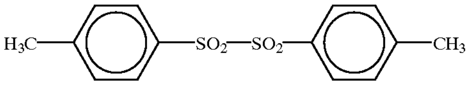
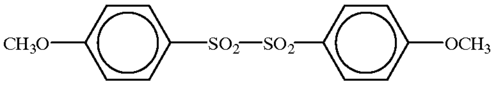
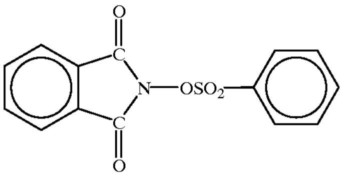
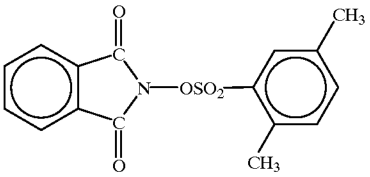
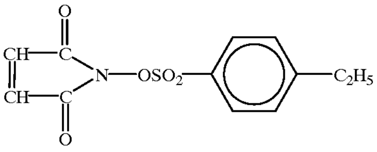
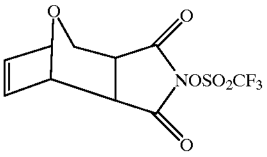
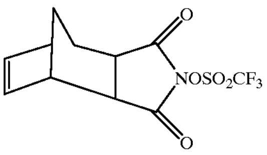
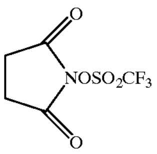
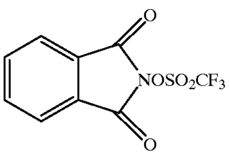

-continued

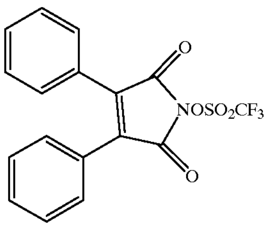

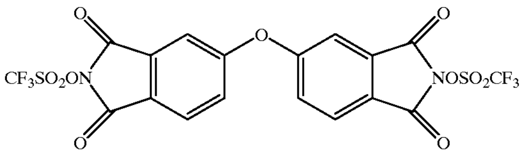

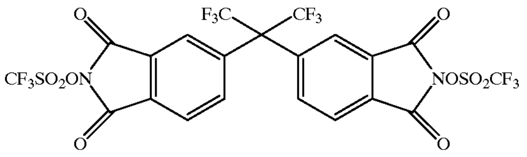

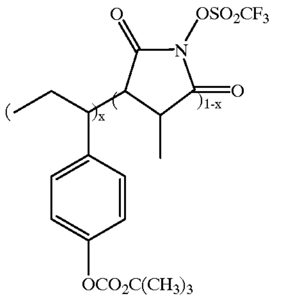

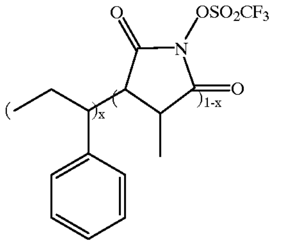

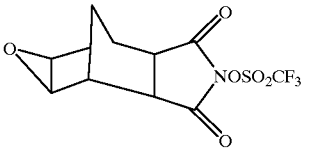

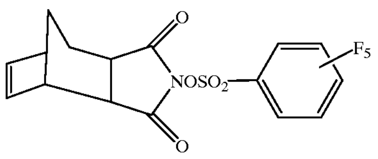

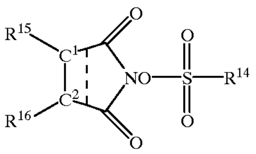

wherein $C^1$ and $C^2$ may be forming a single bond or a double bond; $R^{14}$ is hydrogen atom, fluorine atom, alkyl group or aryl group both of which may be partially substituted by fluorine atom; $R^{15}$ and $R^{16}$ may be the same or different and are individually a monovalent organic group; and $R^{15}$ and $R^{16}$ may be connected together to form a cyclic structure.

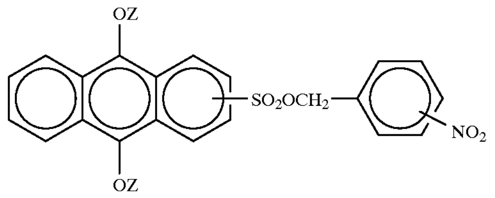

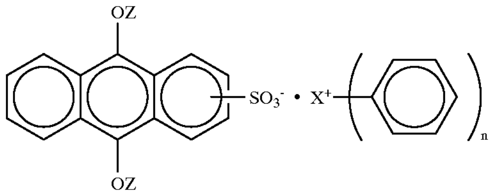

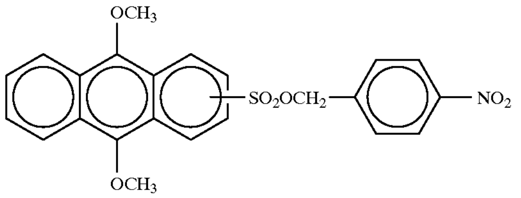

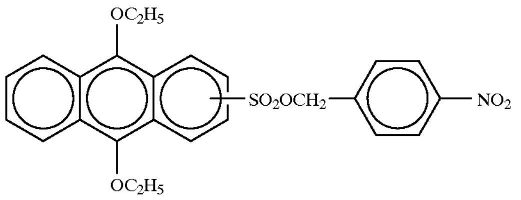

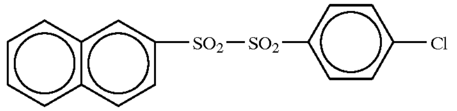

wherein Z represents an alkyl group.

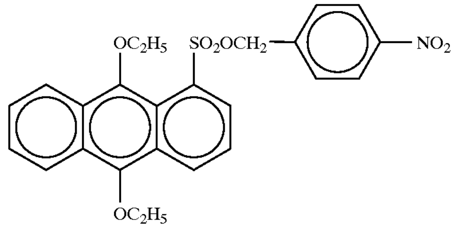

-continued

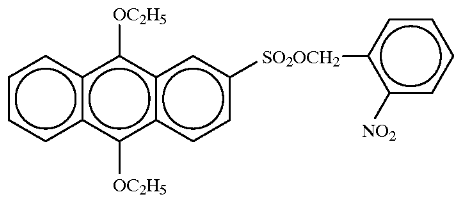

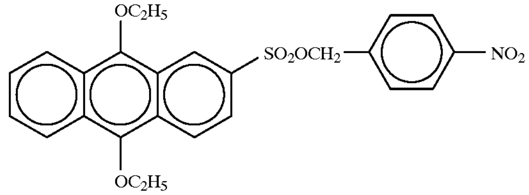

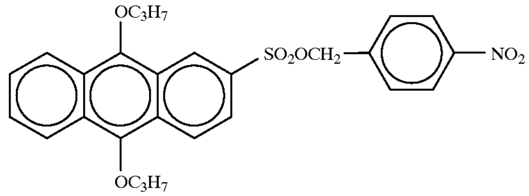

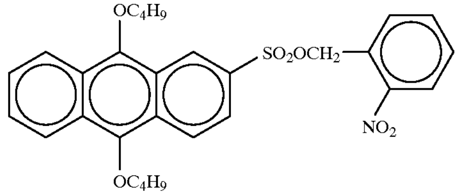

Conjugated polycyclic aromatic compounds having a naphthalene skeleton or dibenzothiophene skeleton, such as an arylonium salt, sulfonate compound, a sulfonyl compound or a sulfonamide compound are more advantageous for the photo-acid-generating agent in view of its excellent transparency to the light of short wavelength and its heat resistance.

Specific examples of such compounds are sulfonyl or sulfonate compounds having a cyclic group such as naphthalene having hydroxyl group attached thereto, pentalene, indene, azulene, heptalene, biphenylene, as-indacene, s-indacene, acenaphthylene, fluorene, phenalene, phenanthrene, anthracene, fluoranthene, acephenanthrylene, aceanthrylene, triphenylene, pyrene, chrysene, naphtacene, pleiadene, picene, perylene, pentaphene, pentacene, tetraphenylene, hexaphene, hexacene, rubicene, coronene, trinaphthylene, heptaphene, heptacene, pyranthrene, ovalene, dibenzophenanthrene, benz[a]anthracene, dibenzo [a,j]anthracene, indeno[1,2-a]indene, anthra[2,1-a] naphthacene or 1H-benzo[a]cyclopent[j]anthracene ring; 4-quinone diazide compounds having a cyclic group such as naphthalene, pentalene, indene, azulene, heptalene, biphenylene, as-indacene, s-indacene, acenaphthylene, fluorene, phenalene, phenanthrene, anthracene, fluoranthene, acephenanthrylene, aceanthrylene, triphenylene, pyrene, chrysene, naphtacene, pleiadene, picene, perylene, pentaphene, pentacene, tetraphenylene, hexaphene, hexacene, rubicene, coronene, trinaphthylene, heptaphene, heptacene, pyranthrene, ovalene, dibenzophenanthrene, benz[a]anthracene, dibenzo[a,j] anthracene, indeno[1,2-a]indene, anthra[2,1-a]naphthacene or 1H-benzo[a]cyclopent[f]anthracene ring; and a salt with a triflate of sulfonium or iodonium having, as a side chain, naphthalene, pentalene, indene, azulene, heptalene, biphenylene, as-indacene, s-indacene, acenaphthylene, fluorene, phenalene, phenanthrene, anthracene, fluoranthene, acephenanthrylene, aceanthrylene, triphenylene, pyrene, chrysene, naphtacene, pleiadene, picene, perylene, pentaphene, pentacene, tetraphenylene, hexaphene, hexacene, rubicene, coronene, trinaphthylene, heptaphene, heptacene, pyranthrene, ovalene, dibenzophenanthrene, benz[a]anthracene, dibenzo[a,j] anthracene, indeno[1,2-a]indene, anthra[2,1-a]naphthacene or 1H-benzo[a]cyclopent[j]anthracene ring.

Among these conjugated polycyclic aromatic compounds, a sulfonyl compound or sulfonate compound having a naphthalene or anthracene; 4-quinone diazide compounds having a naphthalene attaching hydroxyl group thereto or anthracene; and a salt with a triflate of sulfonium or iodonium having, as a side chain, naphthalene or anthracene are preferable in particular.

More preferable examples of the photo-acid-generating agent to be employed in this invention are triphenylsufonium triflate, diphenyliodonium triflate, trinaphthylsufonium triflate, dinaphthyliodonium triflate, dinaphthylsulfonyl methane, NAT-105 (CAS.No.[137867-61-9], Midori Kagaku Co., Ltd.), NAT-103 (CAS.No.[131582-00-8], Midori Kagaku Co., Ltd.), NAI-105 (CAS.No.[85342-62-7], Midori Kagaku Co., Ltd.), TAZ-106 (CAS.No.[69432-40-2], Midori Kagaku Co., Ltd.), NDS-105 (Midori Kagaku Co., Ltd.), PI-105 (CAS.No.[41580-58-9], Midori Kagaku Co., Ltd.), s-alkylated dibenzothiophene triflate and s-fluoroalkylated dibenzothiophene triflate (Daikin Co., Ltd.). Among these photo-acid-generating agents, most preferable examples are triphenylsufonium triflate, trinaphthylsufonium triflate, dinaphthyliodonium triflate, dinaphthylsulfonyl methane, NAT-105 (CAS.No.[137867-61-9], Midori Kagaku Co., Ltd.), NDI-105 (CAS.No.[133710-62-0], Midori Kagaku Co., Ltd.) and NAI-105 (CAS.No. [85342-62-7], Midori Kagaku Co., Ltd.).

The content of the photo-acid-generating agent to be added to the base resin in the resist for alkali development of this invention should preferably be in the range of from 0.001% by weight to 50% by weight, more preferably 0.01% by weight to 40% by weight, most preferably 0.1% by weight to 20% by weight. Because if the content of this acid-generating agent is less than 0.001% by weight, it would be difficult to form a resist pattern in high sensitivity. On the other hand, if the content of this acid-generating agent is more than 50% by weight, the mechanical strength of a resist film to be obtained would be undesirably lowered.

If it is desired to prepare a chemically amplified resist of negative type, a crosslinking agent which is capable of crosslinking a polymer compound constituting the base resin in the presence of an acid may be employed in place of the aforementioned solubility-inhibiting agent.

In this case, it is possible to employ, as the crosslinking agent, a vinyl compound having on its side chain an epoxy group, an acrylic acid or the derivatives thereof represented by the general formula (4), or a melamine type compound such as methylol-substituted triazine, naphthylidine or pteridine compounds. In stead of employing the aforementioned crosslinking agents, vinyl or allyl group may be incorporated as an acidic crosslinking group into a polymer compound.

If $R^{11}$ in the compound represented by the general formula (5) is of double bond, the resultant compound would be exhibiting a photo-reactivity more or less, so that it can be used as a photo-sensitive agent as it is. For example, if such a compound is mixed with an acrylic acid copolymer, the mixture per se can be employed as a positive resist for far ultraviolet rays. Meanwhile, if such a compound is mixed with a phenolic resin such as naphthol novolak, the mixture per se can be employed as a negative resist for far ultraviolet rays.

The resist for alkali development of this invention can be formulated into an ordinary varnish by dissolving any of the aforementioned compounds, a solubility-inhibiting agent, a crosslinking agent, a photo-acid-generating agent and other additives such as an alkali-soluble resin if desired into an organic solvent, and then filtering the resultant solution.

It is also possible in the resist for alkali development of this invention to further incorporate therein other kinds of polymer such as epoxy resin, polymethylmethacrylate, polymethylacrylate, polyethylmethacrylate, propyleneoxide-ethyleneoxide copolymer and polystyrene; an amine compound for improving environmental resistance; a basic compound such as pyridine derivatives; a surfactant for modifying a coated film; and a dye functioning as a reflection-preventing agent.

The organic solvents useful in this case are a ketone-type solvent such as cyclohexanone, acetone, methyl ethyl ketone and methylisobutyl ketone; a cellosolve-type solvent such as methylcellosolve, methylcellosolve acetate, ethylcellosolve acetate and butylcellosolve acetate; an ester type solvent such as ethyl acetate, butyl acetate, isoamyl acetate and γ-butyrolactone; a glycol-type solvent such as propyleneglycol monomethylether acetate; a nitrogen-containing solvent such as dimethylsulfoxide, hexamethylphosphorictriamide dimethylformamide and N-methylpyrrolidone; and a mixed solvent containing dimethylsulfoxide, dimethylformaldehyde or N-methylpyrrolidinone for the purpose of improving the solubility thereof. It is also possible to employ propionic acid derivatives such as methyl methylpropionate; lactates such as ethyl lactate; and PGMEA (propyleneglycol monoethyl acetate), since these solvents are low in toxicity. These solvents may be employed singly or in combination. These solvents may contain a suitable amount of aliphatic alcohol such as isopropyl alcohol, ethyl alcohol, methyl alcohol, butyl alcohol, n-butyl alcohol, s-butyl alcohol, t-butyl alcohol and isobutyl alcohol; or aromatic solvent such as xylene and toluene.

Followings are a detailed explanation on the process of forming a pattern by using the resist for alkali development of this invention.

The varnish of a resist material prepared by dissolving the above mentioned components in an organic solvent is coated on the surface of a substrate by means of a spin-coating method or a dipping method. Then, the coated layer is dried at a temperature of 150° C. or less, or preferably at a temperature of 70 to 120° C. thereby forming a resist film. The substrate to be employed in this case may be for example a silicon wafer; a silicon wafer having an insulating film, electrodes or interconnecting wirings formed on the surface thereof; a blank mask; a Group III-V compounds (such as GaAs, AlGaAs) semiconductor wafer; a chrome- or chrome oxide-deposited mask; an aluminum-deposited substrate; an IBPSG-coated substrate; a PSG-coated substrate; an SOG-coated substrate; or a carbon film-sputtered substrate.

Then, the resist film is irradiated through a predetermined mask with chemical radiation, or the chemical radiation is directly scanned over the surface of the resist film. Since the resist for alkali development according to this invention is excellent in transparency not only to the light of short wavelength but also to the light of wide range of wavelength, the chemical radiation to be employed in this exposure may be ultraviolet rays; X-rays; the i-line, h-line or g-line of low pressure mercury lamp light beam; a xenon lamp beam; a deep UV beam such as KrF or ArF excimer laser beam; a synchrotron orbital radiation beam (SOR); an electron beam (EB); γ-rays; and an ion beam.

The resist film thus patterned is then subjected to a baking step by heating it at a temperature of not more than 170° C. using a hot plate or an oven, or through the irradiation of infrared rays. If the resist for alkali development of this invention is of chemically amplified type, the resist film should preferably be subjected to a baking treatment through heating.

Subsequently, the resist film thus baked is subjected to a developing treatment by way of a dipping method or spraying method using an alkaline solution, thereby selectively removing the exposed portion or unexposed portion of the resist film to obtain a desired pattern. The alkaline aqueous solution useful as the developing solution may be an organic alkali solution such as an aqueous solution of tetramethylammonium hydroxide and corrine, or an inorganic alkali solution such as an aqueous solution of potassium hydroxide and sodium hydroxide. These alkaline solutions may be further added with alcohol or a surfactant. The concentration of these alkaline solutions should preferably be 15% by weight or less in view of obtaining a sufficient difference in dissolution rate between the exposed portion and the unexposed portion.

The resist pattern to be formed by making use of a resist for alkali development according to this invention is very excellent in resolution. For example, when a dry etching is performed with the resist pattern employed as an etching mask, an ultra-fine pattern having line width of the order of quarter micron can be accurately transferred onto an exposed surface of a substrate. Further, according to the resist pattern formed in this manner, even if one of carbon-carbon linkage in the alicyclic structure of a polymer compound constituting a base resin is cut off, other carbon-carbon linkages can be kept undamaged, thereby ensuring an excellent dry etching resistance of the resist. Any additional steps may be included in the aforementioned process of forming a resist pattern. For example, a surface-flattening step for flattening the underlying layer of the resist film; a pretreatment step for improving the adhesion between the resist film and an underlying layer; a rinsing step for removing a developing solution with water for example after the development of the resist film; and a step of re-irradiating ultra-violet rays prior to dry etching may be included.

This invention will be further explained with reference to the following specific examples.

Synthesis of a polymer compound 0.5 mole of N-trimethylsilyloxytetrahydrophtalimide (NTSTHFI) as a polymerizable compound having an alicyclic structure attached with an acidic substituent group exhibiting pKa of 7 to 11 and a polymerizable double bond in its molecule and 0.3 mole of t-butylmethacrylate (t-BM) which is a polymerizable compound having an acid decomposable group were mixed with 200 g of tetrahydrofuran (THF). To the resultant mixed solution was added 2 g of azoisobutylnitrile (AIBN), and the resultant mixture was allowed to undergo a reaction at a temperature of 70° C. for 36 hours. The reaction mixture was then dripped into hexane to obtain a copolymer of NTSTHFI-t-BM having a broad molecular weight distribution, an average molecular weight thereof being about 700. The ratio between NTSTHFI and t-BM in the resultant copolymer was found to be 50:50 as measured by means of NMR.

0.7 mole of N-trimethylsilyloxytetrahydrophtalimide (NTSTHFI) as a polymerizable compound having an alicyclic structure attached with an acidic substituent group exhibiting pKa of 7 to 11 and a polymerizable double bond in its molecule and 0.3 mole of t-butylmethacrylate (t-BM) which is a polymerizable compound having an acid decomposable group were mixed with 150 g of tetrahydrofuran (THF). To the resultant mixed solution was added Ziegler-Natta catalyst (titanium chloride-alkyl aluminum catalyst), and the resultant mixture was allowed to undergo a reaction at a temperature of 70° C. for 9 hours. The reaction mixture was quenched and then dripped into hexane solvent to obtain a copolymer of NTSTHFI-t-BM having an average molecular weight of about 20,000, the ratio between NTSTHFI and t-BM being 70:30.

Various kinds of polymers were synthesized as follows.

The same procedures as described above were repeated except that 6-methyl-6,8,9,10-tetrahydro-1,4-methano-naphthalene-5,7-dione (MTCDO) and 2-cyclohexa-2-enyl-cyclohexane-1,3-dione (CECDO) were employed in place of the NTSTHFI, and were allowed to undergo a reaction by making use of Ziegler-Natta catalyst to obtain MTCDO-t-BM (70:30) copolymer and CECDO-t-BM (70:30) copolymer, respectively.

The same procedures as described above were repeated except that N-trimethylsilyloxy-5-norbornene-2,3-dicarboxyimide (NTSNDI) were employed in place of the NTSTHFI, and were allowed to undergo a reaction by making use of Ziegler-Natta catalyst to synthesize NTSNDI-t-BM copolymer. NTSTHFI-t-BM and NTSNDI-t-BM copolymers were treated with 5 wt % methanol acetate solution to remove trimethylsilyl and hydroxylate these copolymers thereby obtaining HTHFI-t-BM (70:30) copolymer, and HNDI-t-BM (70:30) copolymer, respectively.

Further, 0.7 mole of NTSTHFI and 0.3 mole of methacrylic acid (MA) as a polymerizable compound having an alkali-soluble group were mixed with 200 g of tetrahydrofuran (THF). To the resultant mixed solution was added 2 g of azoisobutylnitrile (AIBN), and the resultant mixture was allowed to undergo a reaction at a temperature of 60° C. for 9 hours. The reaction mixture was then dripped into hexane solvent to obtain a copolymer of THFI-MA having a broad molecular weight distribution, an average molecular weight thereof being about 1,000. The ratio between NTSTHFI and MA in the resultant copolymer was found to be 50:50 as measured by means of NMR.

0.3 mole of 4-cyclopentene-1,3-dione and 0.3 mole of 2-adamantanone were refluxed to be condensed in the presence of an amine catalyst (DCU) and, after being concentrated, the resultant reaction mixture was allowed to recrystallize with ethanol anhydride, thereby obtaining the monomer (ADMCP) represented by the following chemical formula.

ADMCP

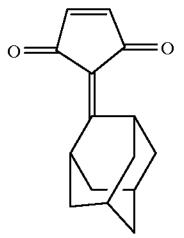

To 70 g of THF were added 0.2 mole of this monomer, 0.1 mole of acrylic acid and 0.1 mole of tert-butylmethacrylate to obtain a mixture. Then, to this mixture was added 0.03 mole of AIBN, and the resultant mixture was polymerized at a temperature of 60° C. for 18 hours to obtain ADMCP-MA-t-BM copolymer having a molecular weight of 5,600.

To 80 g of THF were added 0.2 mole of N-adamantyl maleimide (NAMI), 0.1 mole of acrylic acid and 0.1 mole of tert-butylmethacrylate to obtain a mixture. Then, to this mixture was added 0.03 mole of AIBN, and the resultant mixture was polymerized at a temperature of 50° C. for 40 hours to obtain NAMI-MA-t-BM copolymer having a molecular weight of 7,500.

Acrolein and Meldrum's acid were heated in pyridine at a temperature of 50° C. for 8 hours, and, after being dripped into water, the product was recrystallized with ethanol to obtain a monomer (MALDM). Then, 0.1 mole of the monomer (MALDM) and 0.1 mole of NAMI were added to 40 g of THF. To this resultant mixed solution was added 0.02 mole of AIBN, and the resultant mixture was allowed to polymerize at a temperature of 60° C. for 24 hours to obtain MALDM-NAMI copolymer having a molecular weight of 3,200.

0.1 mole of deoxycholic acid and 0.1 mole of malonyl dichloride were dissolved into 0.3 mole of pyridine thereby allowing them to react with each other. The resultant reaction product was then washed with water and dripped into ether. The product was then filtered to obtain a polymer (DECA-MAL) having a molecular weight of 1,800.

To 70 g of THF were added 0.1 mole of menthylacrylate, 0.1 mole of acrylic acid and 0.1 mole of tert-butylmethacrylate to obtain a mixture. Then, to this mixture was added 0.03 mole of AIBN, and the resultant mixture was polymerized at a temperature of 50° C. for 35 hours to obtain MEN-MA-t-BM copolymer having a molecular weight of 11,000.

Followings are the chemical formulas of polymer compounds synthesized as described above, and the weight average molecular weight of each of these polymer compounds.

HTHFI-t-BM

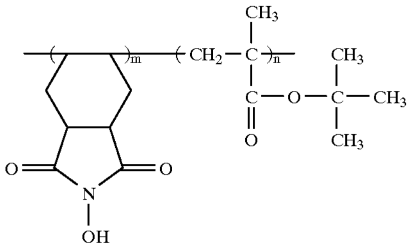

(Average molecular weight:
700(m = 50, n = 50), 12, 000(m = 70, n = 30))

HNDI-t-BM

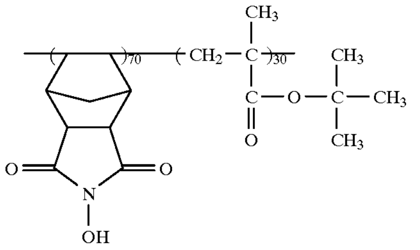

(Average molecular weight: 15, 000)

MTCDO-t-BM

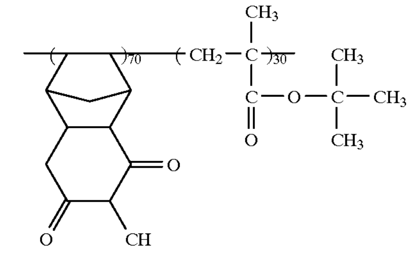

(Average molecular weight: 7, 200)

CECDO-t-BM

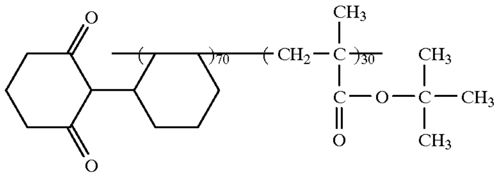

(Average molecular weight: 11, 000)

NTSTHFI-MA

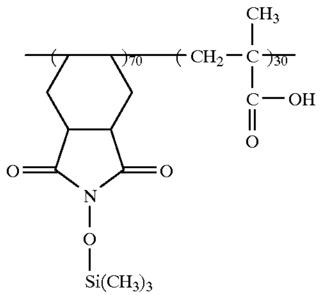

(Average molecular weight: 1, 000)

-continued

ADMCP-MA-t-BM

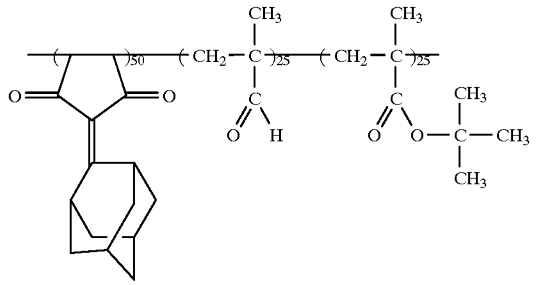

(Average molecular weight: 5, 600)

NAMI-MA-t-BM

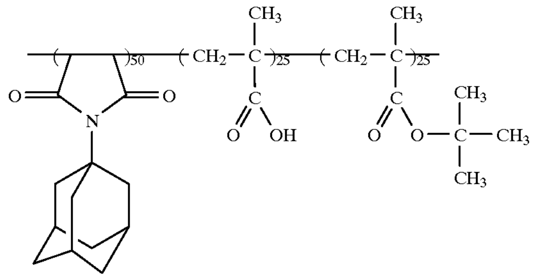

(Average molecular weight: 7, 500)

MALDM-NAMI

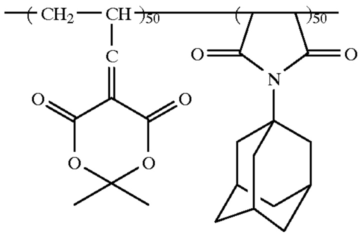

(Average molecular weight: 3, 200)

DECA-MAL

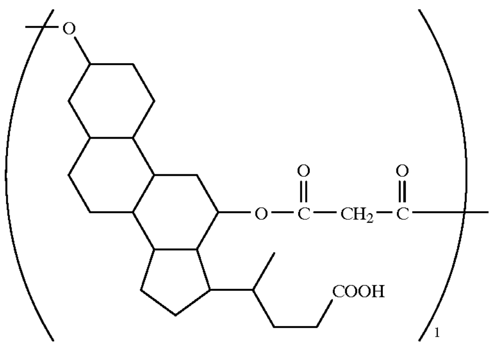

(Average molecular weight: 1, 800)

Synthesis of alicyclic compounds

As for 5-(2-adamantylidene)-2,2-dimethyl-1,3-dioxane-4,6-dione (ADDD), the reagent of aldorich was employed as it was.

0.1 mole of ADDD was dissolved into THF, and 0.1 mole of ethylmagnesium bromide prepared separately was allowed to react with the ADDD in the presence of a copper chloride catalyst. Subsequently, the reaction product was reprecipitated by making use of reflux-water solvent to synthesize 5-(2-ethyladamantyl)-2,2-dimethyl-1,3-dioxane-4,6-dione (ADDM).

0.1 mole of camphor and 0.1 mole of Meldrum's acid were condensed in pyridine to obtain a reaction product. This reaction product was dripped into water to synthesize an alicyclic compound (CDDD) represented by the following chemical formula. 0.1 mole of adamantanone was allowed to react with di-tert-buthymalonate to synthesize ADDT.

0.02 mole of di-tert-butylmalonate was dropped into dispersion of 0.02 mole of NaH in THF at 0° C. Then, 1-adamantyl bromomethyl ketone dissolved in THF was added slowly keeping 0° C. After steering 3 hours, reaction mixture was slowly poured into excess amount of water. Extraction with hexane of this solution yields alycyclic compounds (ADMTB) represented by the following chemical formula.

CDDD

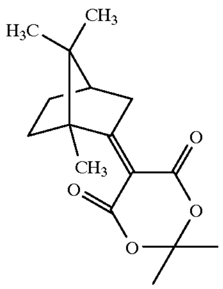

ADDT

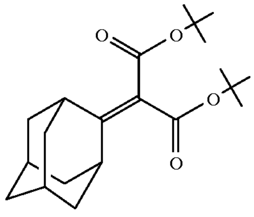

ADMTB

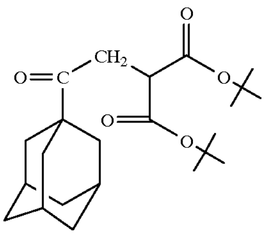

0.1 mole of 1,1"-bi-2-naphthol was dissolved into THF and the resultant solution was mixed with a sufficient amount of di-t-butyl bicarbonate in the presence of 0.22 mole of sodium hydride at room temperature for 4 hours. Subsequently, the reaction solution was poured into water to precipitate a product, which was then filtered to obtain t-buthoxycarbonylated 1,1"-bi-2-naphthol (tBocBN).

0.1 mole of quinalizarin was dissolved into THF and the resultant solution was mixed with a sufficient amount of di-t-butyl bicarbonate in the presence of 0.42 mole of sodium hydride at room temperature for 6 hours. Subsequently, the reaction solution was poured into water to precipitate a product, which was then filtered to obtain t-buthoxycarbonylated quinalizarin (tBocQ).

0.1 mole naphthol equivalent of β-naphthol novolak was dissolved into THF and the resultant solution was mixed with a sufficient amount of di-t-butyl bicarbonate in the presence of 0.1 mole of sodium hydride at room temperature for 6 hours. Subsequently, the reaction solution was mixed with water and a product was extracted with ethyl acetate to obtain t-buthoxycarbonylated naphthol novolak (tBocNN) having a molecular weight of 3,000.

The incorporation ratio of t-buthoxycarbonyl in any of tBocBN, tBocQ and tBocNN was 100 mol % based on the total hydroxyl group.

0.1 mole of pamoic acid was dissolved into dimethyl acetamide, and then boiled for 16 hours in the presence of catalytic amount of trifluoro methane sulfonic acid while bubbling 2-butene gas. The resultant reaction product was diluted with water and then extracted with toluene. Finally, the toluene was distilled off to obtain pamoic acid-t-butyl (PAtB). The incorporation ratio of t-butyl into the carboxyl group in this case was 100 mol %.

0.1 mole of 1,5-dihydroxynaphthalene was allowed to react with a sufficient amount of t-butyl bromoacetate in the presence of potassium carbonate and potassium iodide both functioning as a catalyst. Then, the reaction product was extracted with ethyl acetate to obtain acetic acid t-butylated naphthol (AtBN).

0.5 mole of α-naphthol was mixed with 0.25 mole equivalent of an aqueous solution of formaldehyde, and heated until the α-naphthol was dissolved. Thereafter, the heated mixture was allowed to react under stirring for 3 hours. The reaction product thus obtained was first decompressed down to 2 mmHg and then gradually heated up to 200° C. so as to remove the insufficiently reacted components, thereby obtaining α-naphthol novolak resin having an average molecular weight of 700 (αNN-1).

The same procedures as described above were repeated except that butyral and glyoxylic acid were employed in place of the formaldehyde, thereby obtaining α-naphthol novolak resin having an average molecular weight of 1,000 (αNN-2) and a-naphthol novolak resin having an average molecular weight of 500 (αNN-3), respectively.

Preparation of resist and formation of resist pattern

Each of the polymers synthesized as explained above, a solubility-inhibiting agent and a photo-acid-generating agent were dissolved into cyclohexanone according to the formulations shown in Tables 1 to 3, thereby obtaining a varnish of each resist of Examples 1 to 29. TPS-105 (Midori Kagaku Co., Ltd.), NAT-105 (Midori Kagaku Co., Ltd.), NDS-105 (Midori Kagaku Co., Ltd.), NDI-105 (Midori Kagaku Co., Ltd.) and NAI-105 (Midori Kagaku Co., Ltd.) were employed as a photo-acid-generating agent.

Meanwhile, a copolymer consisted of adamantyl methacrylate (AMM), t-BM and MA (35:40:25) was employed as a polymer compound and NAT-105 was employed as a photo-acid-generating agent to prepare a varnish of resist as a comparative example.

TABLE 1

| | Polymer compound (wt %) | Solubility-inhibiting agent (wt %) | Photo-acid-generating agent (wt %) |
|---|---|---|---|
| Example 1 | HTHFI-t-BM (98) | — | NAT-105 (2) |
| Example 2 | HNDI-t-BM (98) | — | NAT-105 (2) |
| Example 3 | HTHFI-t-BM (88) | tBoc BN (10) | NAT-105 (2) |
| Example 4 | HNDI-t-BM (88) | tBoc Q (10) | NAT-105 (2) |
| Example 5 | HTHFI-t-BM (88) | PAt B (10) | NAT-105 (2) |
| Example 6 | HNDI-t-BM (88) | At BN (10) | NAT-105 (2) |
| Example 7 | HNDI-t-BM (88) | tBoc NN (10) | NDS-105 (2) |
| Example 8 | HNDI-t-BM (88) | tBoc NN (10) | NDI-105 (2) |

TABLE 2

| | Polymer compound (wt %) | Solubility-inhibiting agent (wt %) | Photo-acid-generating agent (wt %) |
|---|---|---|---|
| Example 9 | HNDI-t-BM (88) | tBoc NN (10) | NAI-105 (2) |
| Example 10 | HNDI-t-BM (88) | tBoc BN (10) | NAT-105 (2) |
| Example 11 | MTCDO-t-BM (98) | — | NAT-105 (2) |
| Example 12 | CECDO-t-BM (98) | — | NAT-105 (2) |
| Example 13 | NTSTHFI-MA (88) | tBoc NN (10) | NAT-105 (2) |
| Example 14 | HTHFI-t-BM (75) | α NN-1 (23) | NAT-105 (2) |
| Example 15 | HTHFI-t-BM (75) | α NN-2 (23) | NAT-105 (2) |
| Example 16 | HTHFI-t-BM (75) | α NN-3 (23) | NAT-105 (2) |
| Comparative Example | AMM-t-BM-MA (95) | — | NDI-105 (2) |

TABLE 3

| | Polymer compound (wt %) | Additives (wt %) | Photo-acid generating agent (wt %) |
|---|---|---|---|
| Example 17 | HTHFI-t-BM (98) Mw 700 | — | NAT-105 (2) |
| Example 18 | ADMCP-MA-t-BM (99) | — | TPS-105 (1) |
| Example 19 | NAMI-MA-t-BM (99) | — | TPS-105 (1) |
| Example 20 | MALDM-NAMI (99) | — | TPS-105 (1) |
| Example 21 | DECA-MAL (99) | — | TPS-105 (1) |
| Example 22 | ADMCP-MA-t-BM (79) | ADDD (20) | TPS-105 (1) |
| Example 23 | NAMI-MA-t-BM (79) | ADDM (20) | TPS-105 (4) |
| Example 24 | DECA-MAL (79) | tBocNN (20) | TPS-105 (1) |
| Example 25 | MALDM-NAMI (100%) | — | |
| Example 26 | MEN-MA-tBM (79%) | ADDD (20) | TPS-105 (1) |
| Example 27 | DECA-MAL (80) | NQD-3.0 (20) | |

TABLE 3-continued

| | Polymer compound (wt %) | Additives (wt %) | Photo-acid generating agent (wt %) |
|---|---|---|---|
| Example 28 | NAMI-MA-tBM (69) | ADDT (30) | TPS-105 (1) |
| Example 29 | MEN-MA-tBM (64) | CDDD (10) ADMTB (25) | TPS-105 (1) |

1. NOTE: NQD-3.0 is 4-naphthoquinonediazide sulfonate of 2,3,4,4'-tetrahydroxybenzophenone (incorporation ratio: 75% of total of OH) Toyo Gosei Co.

Each varnish of resist was coated on a silicon wafer to a thickness of 0.6 μm which was then exposed to a prescribed patterning light by making use of a stepper of NA 0.54 employing as a light source an ArF excimer laser beam (wavelength: 193 nm). Then, the resultant resist film was subjected to a baking treatment at a temperature of 110° C. for two minutes and then developed with an aqueous solution of tetramethylammonium hydroxide (TMAH) or with a mixed solution comprising TMAH and isopropyl alcohol thereby selectively dissolving and removing the light exposure portion of the resist film, thus forming a positive resist pattern.

Tables 4 and 5 denote the concentration of developing solutions, sensitivities and resolutions obtained in these examples.

TABLE 4

| | Concentration of developing solution | Sensitivity ($mJ/cm^2$) | Resolution (μm) |
|---|---|---|---|
| Example 1 | 2.38 wt % TMAH | 82 | 0.19 |
| Example 2 | " | 80 | 0.17 |
| Example 3 | 2.54 wt % TMAH | 110 | 0.17 |
| Example 4 | " | 180 | 0.17 |
| Example 5 | " | 115 | 0.17 |
| Example 6 | " | 100 | 0.18 |
| Example 7 | " | 125 | 0.17 |
| Example 8 | " | 100 | 0.20 |
| Example 9 | " | 160 | 0.19 |
| Example 10 | " | 105 | 0.17 |
| Example 11 | " | 95 | 0.18 |
| Example 12 | " | 125 | 0.18 |
| Example 13 | 1.48 wt % TMAH | 55 | 0.17 |
| Example 14 | 2.38 wt % TMAH | 95 | 0.16 |
| Example 15 | " | 75 | 0.15 |
| Example 16 | " | 70 | 0.19 |
| comparative Example | 2.38 wt % TMAH + isopropyl alcohol | 200 | 0.20 |

TABLE 5

| | Concentration of developing solution | Sensitivity ($mJ/cm^2$) | Resolution (μm) |
|---|---|---|---|
| Example 17 | 2.38 wt % TMAH | 90 | 0.18 |
| Example 18 | 1.19 wt % TMAH | 50 | 0.17 |
| Example 19 | 1.19 wt % TMAH | 72 | 0.2 |
| Example 20 | 2.38 wt % TMAH | 28 | 0.18 |
| Example 21 | 0.59 wt % TMAH | 20 | 0.17 |
| Example 22 | 1.19 wt % TMAH | 37 | 0.17 |
| Example 23 | 1.19 wt % TMAH | 45 | 0.18 |
| Example 24 | 0.59 wt % TMAH | 15 | 0.16 |
| Example 25 | 2.38 wt % TMAH | 54 | 0.2 |
| Example 26 | 0.24 wt % TMAH | 18 | 0.16 |
| Example 27 | 0.05 wt % TMAH | 90 | 0.18 |

TABLE 5-continued

| | Concentration of developing solution | Sensitivity ($mJ/cm^2$) | Resolution ($\mu m$) |
|---|---|---|---|
| Example 28 | 1.19 wt % TMAH | 54 | 0.16 |
| Example 29 | 0.24 wt % TMAH | 20 | 0.16 |

As shown in Tables 4 and 5, the resists according to Examples 1 to 29 were found capable of forming a resist pattern excellent in resolution with high sensitivity, and were excellent in transparency to the light of 193 nm in wavelength and in alkaline developing properties.

On the other hand, in the case of the resist according to Comparative Example, it was possible to form a resist pattern excellent in resolution if a developing solution comprising TMAH and 30 wt. % of isopropyl alcohol was employed. However, if only TMAH was employed, a resolution of as low as about 0.5 $\mu m$ could be obtained due to an insufficient alkaline developing properties. Moreover, the resist pattern thus obtained according to Comparative Example was poor in uniformity, and the peeling or cracks of resist pattern could be recognized.

Further, the dry etching resistivity of these resists was evaluated by measuring the etching rate using $CF_4$ plasma. As a result, the etching rate of the resist according to Comparative Example was found to be 1.2 as compared with the etching rate of 1.0 in the resist where novolak resin was employed as a base resin. Whereas in the case of Examples 1 to 29, the etching rate of the resists were found to be 1.0 to 1.2, thus indicating a high dry etching resistance.

As explained above, it is possible according to this invention to provide a resist for alkali development which is excellent in transparency to the light of short wavelength and in dry etching resistance, and capable of forming a resist pattern excellent in resolution by making use of alkali development.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A resist for alkali development comprising an alkali-soluble resin, a photo-acid-generating agent and an alicyclic compound, wherein said alicyclic compound is an acid decomposable compound and is attached with an acidic substituent group exhibiting pKa of 7 to 11 in an aqueous solution of 25° C.

2. The resist for alkali development according to claim 1, wherein said resist exhibits a light absorbency of 3 or less per 1 $\mu m$ to the light of 193 nm in wavelength.

3. The resist for alkali development according to claim 2, wherein at least either one of said acid decomposable compound and said photo-acid-generating agent is formed of a conjugated polycyclic aromatic compound.

4. A resist for alkali development comprising a polymer, an acidic cross-linking compound and a photo-acid-generating agent, wherein said polymer comprises a polymer of an alicyclic monomer attached with an acidic substituent group exhibiting pKa of 7 to 11 in an aqueous solution at 25° C.

5. The resist for alkali development according to claim 4, wherein said polymer exhibits a light absorbency of 3 or less per 1 $\mu m$ to the light of 193 nm in wavelength.

6. The resist for alkali development according to claim 5, wherein said polymer is a copolymer comprising as a comonomer component a vinyl compound.

7. A resist for alkali development comprising a polymer and a photo-acid-generating agent, wherein said polymer is acid decomposable, comprises a polymer of an alicyclic monomer attached with an acidic substituent group exhibiting pKa of 7 to 11 in an aqueous solution of 25° C., and is a copolymer containing a vinyl compound.

8. The resist for alkali development according to claim 7, wherein said polymer exhibits a light absorbency of 3 or less per 1 $\mu m$ to the light of 193 nm in wavelength.

9. The resist for alkali development according to claim 8, wherein at least one of said acid decomposable monomer compound and said photo-acid-generating agent is formed of a conjugated polycyclic aromatic compound.

10. The resist for alkali development according to claim 7, which further comprises a solubility-inhibiting agent.

11. The resist for alkali development according to claim 10, wherein said solubility-inhibiting agent comprises an alicyclic compound attached with an acidic substituent group exhibiting pKa of 7 to 11 in an aqueous solution of 25° C.

12. A resist for alkali development comprising an alkali-soluble resin having an alicyclic structure, a photo-acid-generating agent, and a compound having at least one kind of structural units represented by the following general formulas (1) to (3):

(1)

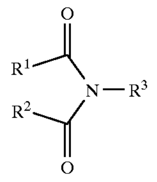

wherein at least one of $R^1$, $R^2$ and $R^3$ is a monovalent organic group including an alicyclic group, at least one of the others $R^1$, $R^2$ and $R^3$ being alkyl group; $R^1$ and $R^2$ may be connected together to form a cyclic compound; and $R^3$ may be hydroxyl group, (2)

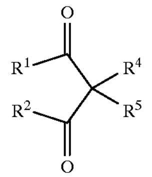

wherein at least one of $R^1$, $R^2$, $R^4$ and $R^5$ is a monovalent organic group including an alicyclic group, at least one of the others $R^1$, $R^2$, $R^4$ and $R^5$ being hydrogen atom or alkyl group; $R^1$ and $R^2$ may be connected together to form a cyclic compound; and $R^4$ and $R^5$ may also be connected together to form a cyclic compound, (3)

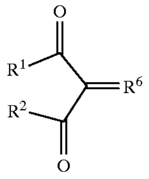

wherein at least one of $R^1$, $R^2$ and $R^6$ is monovalent organic group including an alicyclic group, at least one of the others $R^1$, $R^2$ and $R^6$ being hydrogen atom or alkyl group; $R^1$ and $R^2$ may be connected together to form a cyclic compound.

13. The resist for alkali development according to claim 12, wherein said compound represented by said general formulas (1) to (3) exhibits a pKa value of 7 to 11 in an aqueous solution of 25° C.

14. The resist for alkali development according to claim 12, which further comprises a solubility-inhibiting agents.

15. A resist for alkali development comprising a polymer and a solubility-inhibiting agent, and a photo-acid-generating agent, wherein said polymer comprises an alicyclic monomer compound attached with an acidic substituent group exhibiting pKa of 7 to 11 in an aqueous solution of 25° C., said alicyclic monomer compound being selected from the group consisting of structural units represented by the following general formulas (1) to (3):

(1)

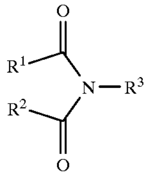

wherein at least one of $R^1$, $R^2$ and $R^3$ is a monovalent organic group including an alicyclic group, at least one of the others $R^1$, $R^2$ and $R^3$ being alkyl group; $R^1$ and $R^2$ may be connected together to form a cyclic compound; and $R^3$ may be hydroxyl group, (2)

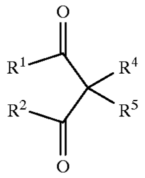

wherein at least one of $R^1$, $R^2$, $R^4$ and $R^5$ is a monovalent organic group including an alicyclic group, at least one of the others $R^1$, $R^2$, $R^4$ and $R^5$ being hydrogen atom or alkyl group; $R^1$ and $R^2$ may be connected together to form a cyclic compound; and $R^4$ and $R^5$ may also be connected together to form a cyclic compound, (3)

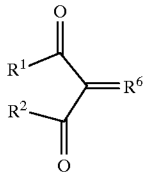

wherein at least one of $R^1$, $R^2$ and $R^6$ is monovalent organic group including an alicyclic group, at least one of the others $R^1$, $R^2$ and $R^6$ being hydrogen atom or alkyl group; $R^1$ and $R^2$ may be connected together to form a cyclic compound.

16. The resist for alkali development according to claim 15, wherein said compound represented by said general formulas (1) to (3) exhibits a pKa value of 7 to 11 in an aqueous solution of 25° C.

17. The resist for alkali development according to claim 15, which further comprises a solubility-inhibiting agent.

18. The resist for alkali development according to claim 17, wherein said solubility-inhibiting agent is a conjugated polycyclic aromatic compound.

19. The resist for alkali development according to claim 15, wherein at least either one of said solubility-inhibiting agent and said photo-acid-generating agent is formed of a conjugated polycyclic aromatic compound.

20. The resist for alkali development according to claim 15, wherein said polymer exhibits a light absorbency of 3 or less per 1 μm to the light of 193 nm in wavelength.

21. The resist for alkali development according to claim 20, wherein said polymer is a copolymer comprising as a comonomer component a vinyl compound.

22. A resist for alkali development comprising a polymer and a photo-acid-generating agent, wherein said polymer contains acid decomposable group, and comprises an alicyclic monomer compound attached with an acidic substituent group exhibiting pKa of 7 to 11 in an aqueous solution of 25° C., said alicyclic monomer compound being selected from the group consisting of structural unit represented by the following general formulas (1) to (3):

(1)

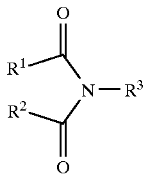

wherein at least one of $R^1$, $R^2$ and $R^3$ is a monovalent organic group including an alicyclic group, at least one of the others $R^1$, $R^2$ and $R^3$ being alkyl group; $R^1$ and $R^2$ may be connected together to form a cyclic compound; and $R^3$ may be hydroxyl group, (2)

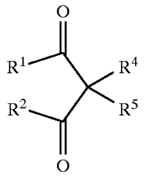

wherein at least one of $R^1$, $R^2$, $R^4$ and $R^5$ is a monovalent organic group including an alicyclic group, at least one of the others $R^1$, $R^2$, $R^4$ and $R^5$ being hydrogen atom or alkyl group; $R^1$ and $R^2$ may be connected together to form a cyclic compound; and $R^4$ and $R^5$ may also be connected together to form a cyclic compound, (3)

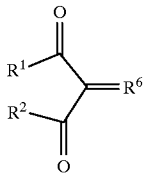

wherein at least one of $R^1$, $R^2$ and $R^6$ is a monovalent organic group including an alicyclic group, at least one of the others $R^1$, $R^2$ and $R^6$ being hydrogen atom or alkyl group; $R^1$ and $R^2$ may be connected together to form a cyclic compound.

23. The resist for alkali development according to claim 22, wherein said compound represented by said general formulas (1) to (3) exhibits a pKa value of 7 to 11 in an aqueous solution of 25° C.

24. The resist for alkali development according to claim 22, which further comprises a solubility-inhibiting agent.

25. The resist for alkali development according to claim 24, wherein said solubility-inhibiting agent is a conjugated polycyclic aromatic compound.

26. The resist for alkali development according to claim 22, wherein at least either one of said solubility-inhibiting agent and said photo-acid-generation agent is formed of a conjugated polycyclic aromatic compound.

27. The resist for alkali development according to claim 22, wherein said polymer exhibits a light absorbency of 3 or less per 1 μm to the light of 193 nm in wavelength.

28. The resist for alkali development according to claim 27, wherein said polymer is a copolymer comprising as a comonomer component a vinyl compound.

29. A resist for alkali development comprising an alkali-soluble resin, solubility-inhibiting agent and a photo-acid-generating agent, wherein at least one monomer in said alkali-soluble resin and solubility-inhibiting agent comprises an alicyclic monomer compound attached with an acidic substituent group exhibiting pKa of 7 to 11 in an aqueous solution of 25° C.

30. The resist for alkali development according to claim 29, wherein at least either one of said solubility-inhibiting agent and said photo-acid-generating agent is formed of a conjugated polycyclic aromatic compound.

* * * * *